(12) United States Patent
Montoya et al.

(10) Patent No.: US 10,557,889 B2
(45) Date of Patent: Feb. 11, 2020

(54) UNIVERSAL DEVICE MULTI-FUNCTION TEST APPARATUS

(71) Applicant: FLEXTRONICS AP, LLC., San Jose, CA (US)

(72) Inventors: Adam Montoya, Louisville, KY (US); Niklas Ake Torberntsson, Linkoping (SE)

(73) Assignee: Flextronics AP, LLC, San Jose, CA (US)

( * ) Notice: Subject to any disclaimer, the term of this patent is extended or adjusted under 35 U.S.C. 154(b) by 580 days.

(21) Appl. No.: 14/386,358

(22) PCT Filed: May 7, 2013

(86) PCT No.: PCT/US2013/039878
§ 371 (c)(1),
(2) Date: Sep. 19, 2014

(87) PCT Pub. No.: WO2013/169728
PCT Pub. Date: Nov. 14, 2013

(65) Prior Publication Data
US 2015/0057961 A1    Feb. 26, 2015

Related U.S. Application Data

(60) Provisional application No. 61/643,785, filed on May 7, 2012, provisional application No. 61/682,641, filed on Aug. 13, 2012.

(51) Int. Cl.
*G01L 15/00* (2006.01)
*G01R 31/319* (2006.01)
(Continued)

(52) U.S. Cl.
CPC ..... *G01R 31/31907* (2013.01); *G01R 1/0416* (2013.01); *G01R 1/06794* (2013.01); *G01R 31/31908* (2013.01)

(58) Field of Classification Search
CPC .......... G01R 31/31907; G01R 1/06794; G01R 31/31908; G06F 11/2294
(Continued)

(56) References Cited

U.S. PATENT DOCUMENTS 6,697,753 B2    2/2004  Samuelson et al.
7,933,117 B2    4/2011  Howarth et al.
(Continued)

OTHER PUBLICATIONS

International Search Report and Written Opinion for International (PCT) Patent Application No. PCT/US13/39878, dated Nov. 1, 2013 10 pages.
(Continued)

*Primary Examiner* — Michael P Nghiem
(74) *Attorney, Agent, or Firm* — Sheridan Ross P.C.

(57) ABSTRACT

Methods and systems for a universal device multi-function test apparatus are provided. Specifically, the universal device multi-function test apparatus is configured to receive multiple device types, manufacturers, and/or models attached to a nest via an interface module. The device can then be subjected to a battery of tests in a unified and controlled test environment. Information related to the initiated tests, even including results, may be associated with the device and stored in memory, written to the device, and/or forwarded for further processing/repair operations.

20 Claims, 9 Drawing Sheets

(51) Int. Cl.
  *G01R 1/04* (2006.01)
  *G01R 1/067* (2006.01)

(58) Field of Classification Search
  USPC .......................................................... 702/121
  See application file for complete search history.

(56) References Cited

U.S. PATENT DOCUMENTS

| | | |
|---|---|---|
| 2003/0014208 A1 | 1/2003 | Glynn et al. |
| 2004/0103344 A1 | 5/2004 | Stephens et al. |
| 2006/0006891 A1* | 1/2006 | Romanov .......... G01R 1/06705 |
| | | 324/750.18 |
| 2006/0069837 A1 | 3/2006 | Zhang et al. |
| 2008/0082887 A1* | 4/2008 | Dhong ............. G01R 31/31853 |
| | | 714/738 |
| 2008/0162992 A1* | 7/2008 | Lonowski .......... G01R 31/2894 |
| | | 714/25 |
| 2010/0130195 A1 | 5/2010 | Rohaly et al. |
| 2011/0161104 A1* | 6/2011 | Gilbert ................... G06N 5/003 |
| | | 705/2 |
| 2011/0184687 A1* | 7/2011 | Morita ............. G01R 31/31907 |
| | | 702/118 |
| 2011/0227597 A1* | 9/2011 | Leino ...................... H04M 1/24 |
| | | 324/756.07 |

OTHER PUBLICATIONS

International Preliminary Report on Patentability for International (PCT) Patent Application No. PCT/US2013/039878, dated Nov. 20, 2014 7 pages.

\* cited by examiner

UNIVERSAL DEVICE MULTI-FUNCTION TEST APPARATUS

CROSS REFERENCE TO RELATED APPLICATIONS

The present application claims the benefits of and priority, under 35 U.S.C. § 119(e), to U.S. Provisional Application Ser. Nos. 61/643,785, filed on May 7, 2012, entitled "Universal Device Multi-Function Test Apparatus"; and 61/682,641, filed on Aug. 13, 2012, entitled "Universal Device Multi-Function Test Apparatus." The entire disclosures of the applications listed above are hereby incorporated by reference, in their entirety, for all that they teach and for all purposes.

BACKGROUND

From the personal digital assistant ("PDA") to the smartphone, the portable device has evolved to become the focus point of a digitally-connected life. Not only are the portable devices steadily increasing in processing power, but are incorporating more components and features to accommodate the needs and desires of society in general. The average portable device acts as a phone, calendar, email access point, Internet browser, media consumption and/or creation device, and portable computing platform. Coupled with the use of custom designed software applications, the portable device has become an invaluable resource to those who use them.

As the complexity and sophistication of these devices increases, so do the possibilities for mechanical or electrical failures. Because of the user's incredible reliance on the portable device even a minor component or feature failure may be considered grossly disruptive. As a result, manufacturers and repair facilities are under incredible pressure to provide rapid turnaround times for analyzing and repairing device failures. Unfortunately, the analysis and repair of a device has been, to this point, a very manual process.

Currently, a user with a defective device may send it to a repair facility to be analyzed and repaired. In some cases, the device may be accompanied by an explanation of the failure, but in most cases the device needs to be completely analyzed for an unknown failure and/or combination of failures. Once received at the facility, the device is manually and sequentially connected to a series of test equipment apparatuses and/or fixtures according to repair facility procedures. There, the device is subjected to numerous functional tests. However, this battery of tests is usually separated into several stations across different locations of a facility. As such, the sequential transfer of a device from one station to another causes confusion, reduces accuracy of traceability, and adds time to the overall process of analyzing and repairing the device.

To add a level of complexity to the problem, a typical repair facility may provide services to analyze and/or repair a number of devices from multiple manufacturers. Multiple manufacturers and/or multiple models within a manufacturer's product range can cause a number of different connections, features, and/or device sizes. The typical repair facility must be configured to receive and service this range of devices. Moreover, the facility must be capable of changing from servicing one manufacturer/model of device to another as required. Unfortunately, this type of change-over is typically a slow, costly, and manual process.

SUMMARY

There is a need for a universal device multi-function test apparatus capable of receiving different devices/models, in some cases from multiple manufacturers, and integrating combined test equipment into a single apparatus. These and other needs are addressed by the various aspects, embodiments, and/or configurations of the present disclosure. Also, while the disclosure is presented in terms of exemplary embodiments, it should be appreciated that individual aspects of the disclosure can be separately claimed.

In embodiments, an apparatus for testing an electronic device is provided, comprising: one or more test modules to test one or more of an operation and characteristic of an electronic device and output a result of the test; a test management module in communication with the one or more test modules, wherein the test management module applies the one or more test modules in a first test sequence, and wherein the test management module receives the result of each test applied in the first test sequence; a control computer that analyzes the result of each test applied and determines whether the result of each test applied requires a modification to at least one of an order of the one or more test modules and an inclusion of the one or more test modules applied in the first test sequence, and when at least one of the results of each test applied requires a modification to the first test sequence, instructs the test management module to dynamically modify the first test sequence; and a communications module, in communication with the test management module, configured to forward a modified first test sequence to a second test management module.

In another embodiment, a system for testing electrical devices is provided, comprising: a plurality of test apparatuses in communication with one another, wherein each of the plurality of test apparatuses comprises: one or more test modules to test one or more of an operation and characteristic of an electronic device and output a result of the test; a test management module in communication with the one or more test modules, wherein the test management module applies the one or more test modules in a first test sequence, and wherein the test management module receives the result of each test applied in the first test sequence; a control computer that analyzes the result of each test applied and determines whether the result of each test applied requires a modification to at least one of an order of the one or more test modules and an inclusion of the one or more test modules applied in the first test sequence, and when the result of each test applied requires a modification to the first test sequence, instructs the test management module to dynamically modify the first test sequence; and a communications module, in communication with the test management module, configured to forward a modified first test sequence to a second test management module.

In yet another embodiment, a method of dynamically ordering a test sequence for testing an electronic device is provided, comprising: receiving a result of one or more tests applied in a first test sequence, wherein the one or more tests are applied by one or more test modules and are configured to test one or more of an operation and characteristic of an electronic device; analyzing, by a test management module, the result of the one or more tests applied in the first sequence; determining, based on the analysis, whether to modify the first test sequence; modifying, at least one of an order of the one or more tests and an inclusion of the one or more tests applied in the first test sequence dynamically and in response to determining to modify the first test sequence; and forwarding a modified first test sequence to another test management module.

The present disclosure can provide a number of advantages depending on the particular aspect, embodiment, and/or configuration. Among other things, by providing a single multi-function testing apparatus with a comprehensive testing protocol and information control system the device analysis and repair process can be unified and streamlined.

These and other advantages will be apparent from the disclosure.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "display" refers to a portion of a screen used to display the output of a computer to a user.

The term "displayed image" refers to an image produced on the display. A typical displayed image is a window or desktop. The displayed image may occupy all or a portion of the display.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "module" as used herein refers to any known or later developed hardware, software, firmware, artificial intelligence, fuzzy logic, or combination of hardware and software that is capable of performing the functionality associated with that element.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

The term "screen," "touch screen," or "touchscreen" refers to a physical structure that enables the user to interact with the computer by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "window" refers to a, typically rectangular, displayed image on at least part of a display that contains or provides content different from the rest of the screen. The window may obscure the desktop.

The terms "determine," "calculate," and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a universal device multi-function test apparatus, system, and method. As described herein, the device(s) may be electrical, mechanical, electro-mechanical, software-based, and/or combinations thereof.

The present disclosure can provide a number of advantages depending on the particular aspect, embodiment, and/or configuration. Currently, when a device is received at a repair facility, the device is processed to determine its capabilities and/or functionality. Processing a device includes subjecting it to a series of controlled tests. These controlled tests may include a combination of hardware and/or software tests such as inspecting the functionality of one or more of buttons (e.g., power, volume, sleep/lock, mute, rotation lock, etc.), switches, screen(s) (pixel count, brightness, color range, response, etc.), speakers, audio input/output (loudness, range of tones, etc.), sensors (e.g., screen-dimming, camera, audio, video), components (accelerometer, gyroscope, GPS, Wi-Fi, Bluetooth, vibrator motor) and more.

In one embodiment of the present disclosure a universal device multi-function test apparatus is described. Specifically, the present disclosure is directed to an apparatus that includes multiple test equipment in a single machine and controlled environment. In some embodiments, the apparatus may comprise one or more of a machine frame, a receptacle configured to receive a device nest, a nest interface module, electrical interface connection, an acoustic, or audio, module, camera module, speaker module, lighting module(s), network and/or automation interface, and controls system.

Figure 1A:
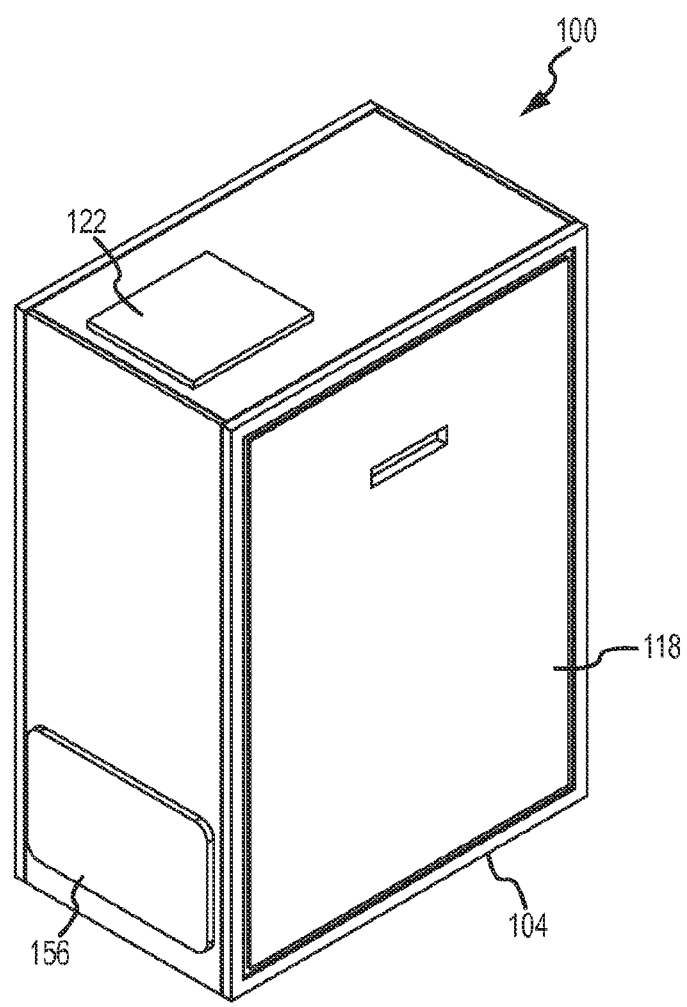
FIG. 1A is a perspective view of a universal device multi-function test apparatus in accordance with embodiments of the present disclosure.

Referring to FIG. 1A, a perspective view of a universal device multi-function test apparatus 100 is shown in accordance with embodiments of the present disclosure. The apparatus 100 may include at least one of a frame 104, a panel 118, an access hatch 122, and a nest loading drawer, or panel, 156. A plurality of panels 118 may be included to restrict access to parts of the apparatus 100 during operation. As can be appreciated, the panels 118 may be interconnected to safety interlocks or switches. In some embodiments, the apparatus 100 may include an access hatch 122 to maintain or access various components or areas of the apparatus 100. For instance, the access hatch 122, may provide access to one or more components of the apparatus 100 that may require routine maintenance or replacement (e.g., oiling a slide or actuator, replacing an O-ring or seal, changing out tooling, replacing an illumination source such as a light bulb, LED, or the like, and more). In one embodiment, the plurality of panels 118 may provide access to one or more components of the apparatus as previously disclosed for the access hatch 122. The loading drawer 156 can provide access to a device nest loading area of the apparatus 100. In some instances, the loading drawer 156 may be connected to a slide and allow for a device nest to be loaded in the apparatus 100, by pulling the loading drawer 156 away from the apparatus 100. Additionally or alternatively, the loading drawer 156 may be hinged. In any event, the loading drawer 156 may serve to provide access to the apparatus 100 and even interconnect with an operation switch to activate operations of the apparatus 100.

Figure 1B:
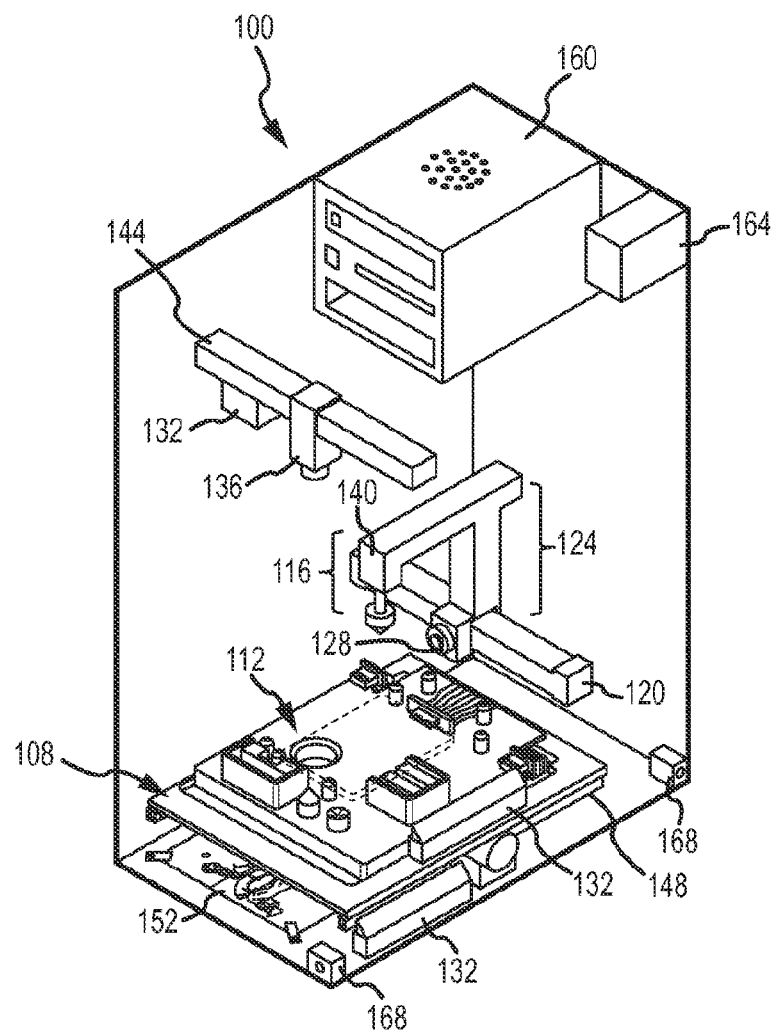
FIG. 1B is a perspective view of a universal device multi-function test apparatus with structural elements removed accordance with embodiments of the present disclosure.

FIG. 1B shows a perspective view of a universal device multi-function test apparatus with structural elements removed accordance with embodiments of the present disclosure. As shown in FIG. 1B, sections of the frame 104 and the panels 122 have been removed. The apparatus 100 can include at least one of supports 144, 148, a plurality of test equipment modules 112-140, a control computer 160, a communications module 164, and a safety interlock 168. In some embodiments, the apparatus 100 may include a nest interface module 108 configured to receive a device nest 112. For instance, a device in a device nest 108 may be loaded onto the nest interface module 108 of the apparatus 100. Once the device nest 112 is loaded onto the nest interface module 108, the nest interface module may engage the device nest 108 and even the device in a testing position.

In one embodiment, the plurality of test equipment modules 112-140 and other equipment may be contained within an area of the apparatus 100. This area may be controlled with regard to environmental conditions. In some embodiments, one or more tests may be associated with analyzing a device may require a controlled environment, and as such the apparatus may be configured to provide this type of environment. The controlled environment may include control of temperature, sound, light, humidity, electrical interference, and/or combinations thereof. Among other things, the ability to control the environmental conditions can eliminate a number of variables that can adversely affect the accuracy of test results from an apparatus 100. For instance, when the ambient lighting, temperature, and even humidity are controlled during a test procedure, any test result variations can be evaluated for conditions other than ambient lighting, temperature, and humidity. In some cases, the apparatus 100 shields from interference from unwanted sound, light, electrical energy, radio waves, etc. During testing, the apparatus 100 may provide one or more stimuli, even at varying levels, to test a device. These stimuli may create a sound, light, electrical energy, radio waves, combinations thereof, and the like.

One or more of the plurality of test equipment modules 112-140 may be attached to a positioning system 124. The positioning system 124 may comprise at least one actuator 120 configured to move about a linear and/or rotational axis. In the event that test equipment is attached to a positioning system 124, the attached test equipment may move in a corresponding movement to the movement provided by the one or more actuators 120 of the positioning system 124. In some embodiments, the test equipment may include an actuator 120 or positioning system 124 that is part of the test equipment. Additionally or alternatively, test equipment may be attached to the apparatus 100, frame 104, a support 144, 148, or the like.

In some embodiments, the apparatus 100 may communicate via a communications module 164 to send and/or receive testing information across a communications network. For example, the apparatus 100 may send results from performed tests to a server for evaluation and/or storage. In one example, the apparatus 100 may communicate with a server via the communications module 164 to receive one or more test procedures, updated programs, gold standards, and the like. In some cases, the computer 160 may run the various components of the apparatus 100. The computer 160 may communicate with a server to download test procedures, etc. and execute them.

Figure 2:
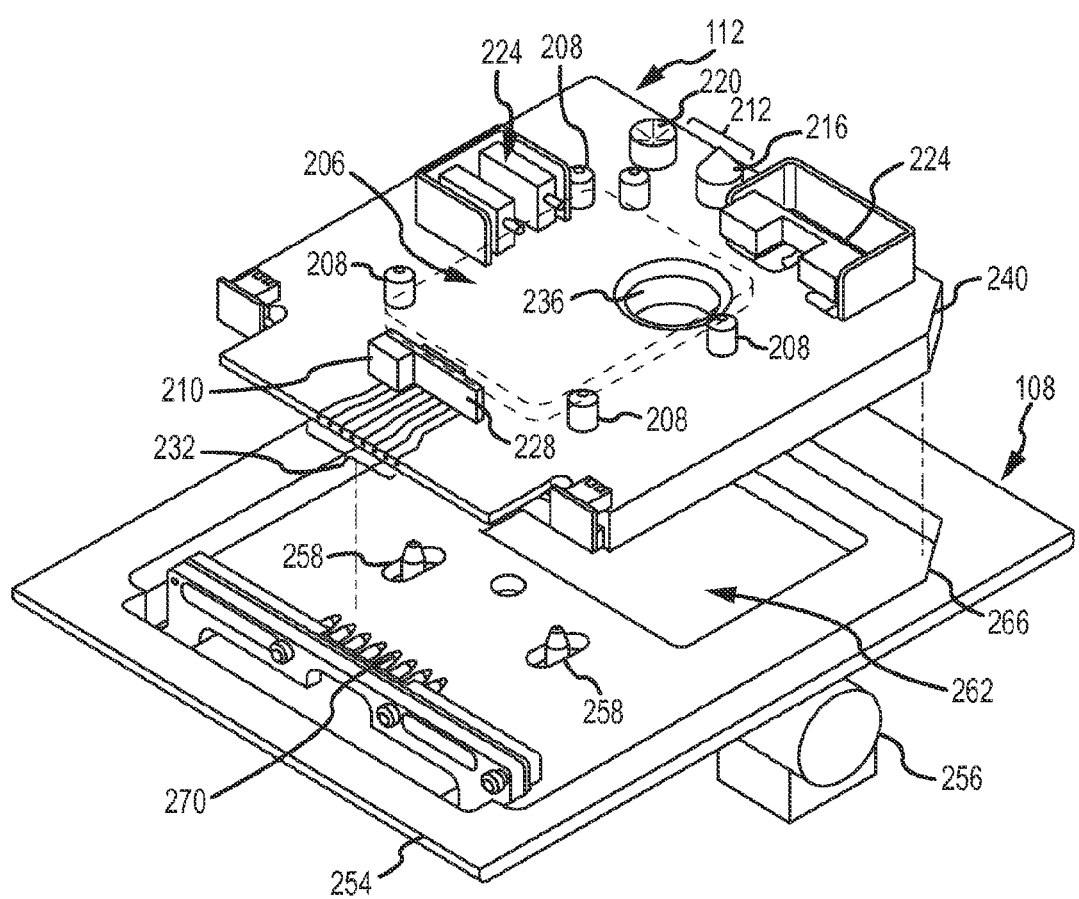
FIG. 2 is an exploded perspective view of a device, device nest, and a nest interface module in accordance with embodiments of the present disclosure.

FIG. 2 shows an exploded perspective view of a test device, device nest 112, and a nest interface module 108 in accordance with embodiments of the present disclosure. In some embodiments, a device nest 112 may be configured to receive a specific device or combination of devices. For example, the device nest 112 may be constructed using a feature 208 or series of features 208 to locate a particular device in a particular location. These location features 208 may include the use of pins, slots, grooves, fasteners, clamps, and/or one or more datum faces operatively connected to the nest base. A nest clearance window 236 may be included in the device nest 112. In one embodiment, the nest clearance window 236 may be oriented adjacent to a device 316 camera, or other sensor, to provide access to testing a functionality or characteristic of the camera, or other sensor. When operatively connected to the nest interface module 108, the nest clearance window 236 may align with a nest interface clearance window 262. The nest interface module 108 and/or the device nest 112 may include a plurality of clearance windows 262, 236. In some embodiments the device nest 112 may include a device contact surface 206. The device contact surface 206 may be configured to contact at least one surface of a device.

In some embodiments, the device nest 112 may be configured to position and/or contain an electronic device 316. The device nest 112 can be configured to fit one or more device 316 sizes of varying size, dimension, and functionality. For example, the device nest 112 may be configured to fit devices that may include, but are not limited to, small electronics and portable devices (such as phones, smart phones, mp3 players, and the like) and even configured to accommodate larger electronic devices (such as tablets, personal computers, credit card scanners (terminals, machines), eReaders, GPS (and equivalent) navigation devices, etc.). In one embodiment, the general shape and dimensions of the device nest 112 may be configured to incorporate standard, or universal, features. These universal device nest features may be used to ensure a repeatable connection between the device nest 112 and the apparatus 100. This repeatable connection may be achieved via mechanical, electrical, or electro-mechanical features. In other words, the device nest 112 may incorporate features to allow the device nest 112 to be repeatably, and even kinematically, connected to a receiving nest holder, or nest interface module 108. As can be appreciated, the nest interface module 108 may incorporate mating features, connections, and the like to interface with the device nest 112 and/or its universal device nest features. These interface, or mating, features and/or connections may be operatively connected to the nest interface base 254.

In some embodiments, a device nest 112 may be configured to receive a particular device brand, model, or product line. For instance, the device nest 112 may include features to orient a particular device. Moreover, the device nest 112 may be configured to provide button and/or switch actuators 224 adjacent to corresponding button and/or switch locations on a device. The button and/or switch actuators 224 may be mechanical, electrical, or electromechanical. In one embodiment, one or more of the actuators may include a wedge, cam, and spring return mechanism to provide access to multiple buttons and/or switches, from one side of the device. For example, the device may only have access on a first side of the device to interface with its buttons and switches (e.g., from the glass touch-screen surface side of a device). However, most devices include at least one button or switch on an alternate side from the first side of the device. It is an aspect of the present disclosure, that these buttons and/or switches may be activated through the mechanism 224 disclosed above. In at least one embodiment, the mechanism 224 can resolve a first directional force and/or movement into a second directional force and/or movement. For instance, a contact made to a first side of the mechanism 224 may cause the mechanism 224 to translate the force from that contact to another side, or sides, of the mechanism 224 and contact a button and/or switch located on the side of the device inside the nest 112.

In accordance with embodiments of the present disclosure, the device nest 112 may be manufactured at least partially from a wear resistant material. Additionally or alternatively, the wear resistant material may be configured to provide a "soft" contact area to interface with at least one portion of a test piece, or device. For instance, the ideal wear resistant material should be constructed to prevent wear, while remaining soft, and without cold flowing or deforming that may adversely affect measurement accuracy. Examples of this type of material may include glass reinforced plastic, glass-epoxy composites, industrial laminates such as Garolite G-9, Garolite G-10, Garolite G-11, phenolics, paper-based phenolic, linen-based phenolic, canvas-based phenolic, Etronit phenolic, Etronit AS, high pressure laminates, electrostatic discharge (ESD) protective and anti-static (AS) materials, and the like.

It is an aspect of the present disclosure that the device nest 112 may include one or more orientation features 240 to align and/or interface with a nest interface module 108 of the apparatus 100. Among other things, the orientation feature 240 ensures that a device nest 112 engages with a nest interface module 108 in a specific orientation only (e.g., employing poka-yoke, error-proofing, and alignment and/or orientation techniques). In some embodiments, the orientation feature 240 may be identical for all device nests 112 that interface with the nest interface module 108.

In accordance with embodiments of the present disclosure the device nest 112 may include one or more of a solenoid, actuator, electrical connection, reference marker, fiducial, and test equipment. As can be appreciated, these one or more features may be used in the testing associated with a device. For example, a camera 136 of the apparatus 100 may calibrate by referring to a fiducial or reference marker on the device nest 112 and then proceed to test the device in the device nest 112. In some embodiments, the apparatus 100 may make use of reference markers on the device itself.

The device nest 112 may include at least one electrical interconnection 228 configured to electrically attach a device to the device nest 112. For instance, the pins and/or electrical contacts associated with a device may correspond to a pin out or universal connection area 232 of the nest 112. In other words, the electrical contacts of a device may be separated and arranged into a universal electrical contact area 232 on the nest 112 comprising one or more contact points. It is anticipated that an electrical communication between the device and the apparatus may be achieved via the electrical interconnection 228 that is electrically coupled with the universal electrical contact area 232. By providing the electrical interconnection to a device on the nest 112 itself, rather than coupling and decoupling electrical connections to the apparatus 110, various nests 112 can be preloaded (or setup and queued) while tests are being performed by the apparatus 100 on a nest 112 that has been connected to the apparatus 110.

In an exemplary embodiment, the various electrical connections from a device may be expanded to a universal connection area 232 located on the device nest 112. This universal connection area 232 may be included adjacent to a common area of a nest interface surface. Furthermore, the universal connection area 232 may include assigned, or known, electrical connection points in a specific order. For instance, a typical device may include pinouts for one or more of a ground, sending line, receiving line, power supply, data, accessory indicator, serial enable, video, audio, and more. These pinouts may be represented by corresponding and specific expanded electrical connection points of the universal connection area 232 of the device nest 112. By assigning the expanded electrical connection points to a specific pinouts, especially those pinouts shared between devices, the nest interface module 108 may not require reconfiguring to accommodate a new device or device type (e.g., the ground connection may always be assigned to Pin 1 of the expanded connection, the 3.3V power connection may always be assigned to Pin 2, and so on) on a device nest 112. In one embodiment, the device nest 112 contains the electrical expansion connection scheme such that a specific device nest 112 and connection may be associated with a particular device type, make, manufacturer, model, version, and combinations thereof, etc.

It is anticipated that the universal connection area 232 of the device nest 112 may be configured to electrically couple with an electrical connection 270 of a nest interface module 108. In some embodiments, the electrical connection 270 of the nest interface module 108 may correspond to a series or electrical connector pins. For example, the universal connection area 232 of the device nest 112 may correspond to electrical receptacles, which are configured to couple with, and/or receive, the electrical connector pins of the nest interface module 108.

Additionally or alternatively, the device nest 112 may be configured to identify itself as belonging to the particular device brand, model, or product line. For example, each device nest 112 may include a memory 210 configured to store identification information relating to its configuration. In one case, the device nest 112 may include Multibank Dynamic Random Access Memory ("MDRAM") or other memory to, among other things, store identification information. It is anticipated that the device nest 112, when connected to the universal device multi-function test apparatus 100, can communicate its configuration by informing the universal device multi-function test apparatus 100 what type of device nest 112 and/or device is connected to the nest 112. Additionally or alternatively, the identification information communicated to the universal device multi-function test apparatus 100 from the nest memory 210 may include, but is not limited to, specific coordinates of one or more calibration features 212 (post, point, area, etc.), the serial number of the nest, serial number of the device, product type, and the like. As can be expected, this identification information may be used in an automated facility to, among other things, provide traceability. As disclosed herein, calibration features 212 may include tooling or inspection balls, a calibration post and cone 216, a calibration post and tapered cavity 220, a series of datum surfaces, and the like.

In some embodiments, the device nest 112 is configured to engage with a nest interface module 108. The nest interface module 108 may be mechanically and/or electrically connected to the universal device multi-function test apparatus 100. The device nest 112 is capable of being removably attached to the nest interface module 108. It is anticipated that a device may be loaded into a device nest 112 and the device nest 112 then engaged with the nest interface module 108. In some embodiments, the nest interface module 108 comprises an engagement mechanism 258, device nest receiving feature(s) 266, and electrical connection 270 to the device nest 112. As disclosed herein, the electrical connection 270 can allow the pinouts of a device to electrically connect to the universal multi-function test apparatus 100. Among other things, the electrical connection 270 can facilitate the identification and testing of a device and/or a device nest 112 in the nest interface module 108. It is anticipated that the apparatus 100 may make use of the electrical connection to the device in order to provide control signals, power, and other monitoring and testing information to the device. In some cases the electrical connection may facilitate the transfer of standardized routines for a device to run. These routines may be developed to determine optimal performance characteristics of the apparatus 100, a device, and/or a group of devices.

In one embodiment, a loaded device nest 112 (e.g., a device nest 112 with a device, etc.) may be manually loaded onto the nest interface module 108. As can be appreciated, the nest interface module 108 may be arranged such that the device nest 112 can be automatically loaded onto the nest interface module 108. In one embodiment, the nest interface module 108 may include an actuator 256 that is operatively connected to a nest engaging feature 258. The nest engaging feature 258 may mate with a corresponding receiving feature on the device nest 108. When the actuator 256 is activated, the engaging feature 258 may move the device nest 112 from an unconnected position to a connected position. In an exemplary embodiment, the nest interface module 108 engages one or more features of the device nest 112 and indexes the nest into a connected position. This index may be accomplished by one or more motors, solenoids, levers, mechanisms, and or actuators. Moreover the index may be initiated in response to a received input. The connected position can correspond to at least one of an electrical connection (e.g., between the universal connection area 232 of the device nest 112 and the electrical connection area 270 of the nest interface module 108) and a mechanical connection (e.g., such that the orientation feature 240 of the device nest 112 locates with the nest receiving feature 266 of the nest interface module).

It is a further aspect of the present disclosure that the loading and unloading of the universal device multi-function test apparatus 100 as well as its operation may be completely automated. Once the device nest 112 is loaded onto a nest interface module 108 the module 108 may be mechanically and/or electrically connected to the apparatus 100. In one embodiment, the device nest 112 may be engaged and/or connected with the apparatus 100 via an actuator associated with the apparatus 100. Once the device nest 112 is indexed into the electrical connection of the apparatus, either directly or via the nest interface module 108, one or more tests provided by the apparatus's 100 various components can begin.

Figure 3:
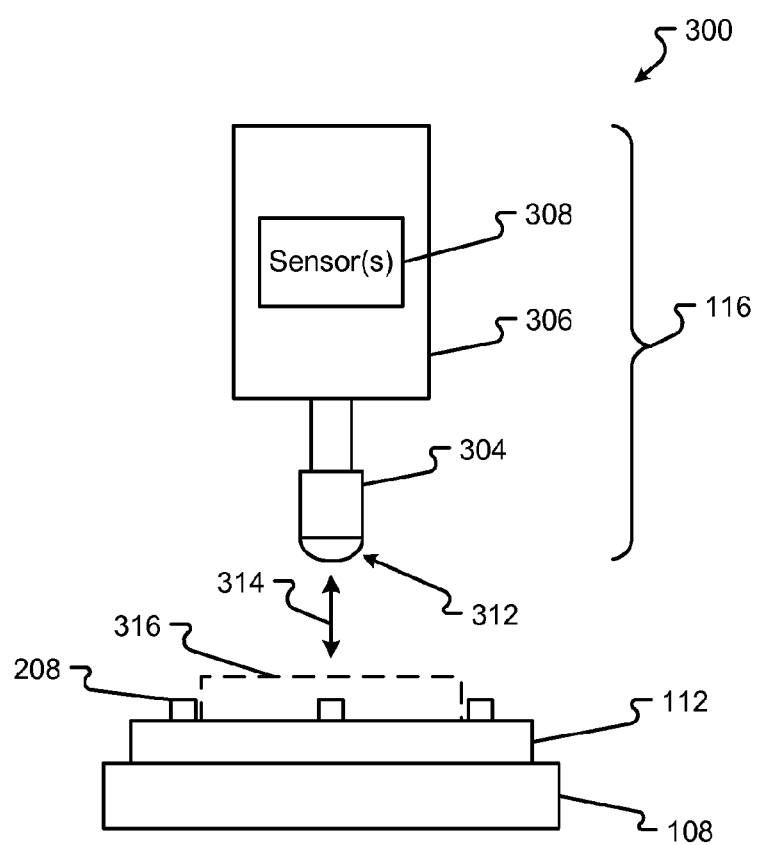
FIG. 3 is an elevation view of part of a tactility module in accordance with embodiments of the present disclosure.

FIG. 3 shows an elevation view 300 of part of a tactility module 116 in accordance with embodiments of the present disclosure. The tactility module 116 may comprise one or more contact probes 304, or end-effectors, an actuator 306, and at least one sensor 308. It is an aspect of the present disclosure that the contact probe 304 may be interchangeable. Additionally or alternatively, the contact probe 304 may include quick-connect and/or kinematic features that may facilitate a quick and reliable replacement or exchange. As can be appreciated, the contact probe 304 may be replaced based on wear, specific capabilities, and the like. For example, a capacitive touch contact probe 304 may be utilized to engage with touch-screen features of a device 316, while a resistive touch contact probe 304 may be employed to engage with resistive-touch devices. In some instances, the contact probe 304 may be changed based on a specific test performed by the apparatus 100. By way of example, it may be beneficial to use a contact probe made from a rigid, or non-compliant, material (e.g., capable of proportionally transmitting force) when a device 316 is subjected to a vibration or tactile feedback test. Such rigid materials may include, but are not limited to, plastics, phenolics, paper-based phenolics, laminates, metals, hard rubbers, and composites thereof.

In some embodiments, the tactility module 116 may utilize an actuator 306 (e.g., a motor, drive, etc.) in conjunction with an encoder to provide an accurate positional feedback and control of an end-effector and/or contact probe 304. The actuator 306 may be an alternating current ("AC") or direct current ("DC") motor and may even comprise stepper or servo motor functionality. In some instances, the actuator 306 may be powered via a compressible fluid (e.g., pneumatic, hydraulic, etc.) and controlled via one or more valves. In any event, the actuator 306 may be programmed to make specific moves, perform calibration routines, and/or exhibit certain characteristics related to movement. For instance, the actuator 306 may be configured to modify output speed, acceleration, deceleration, rotation, calibration, torque, revolutions per minute ("RPM"), incremental movement, and combinations thereof.

In one embodiment, the tactility module 116 may combine functionality associated with the actuator 306, and/or encoder, with the feedback and response derived from one or more sensor 308 associated with the end-effector and/or contact probe 304. For example, the actuator 306 may be configured to position the end-effector and/or contact probe 304 at a first position that is adjacent to a device 316 or device feature to be tested. Once oriented in this first position at a first distance from the device 316, the actuator 306 may be programmed to index to a second position, which is at a second, and possibly closer, distance to the device 316. In this case, the contact probe 304 may have been moved from high above a device button to a position at or very near the surface of the device button. Next, the contact probe 304 may be caused to contact the device button, or device 316, and use the one or more sensors 308 that are operatively connected to the contact probe 304 to provide a force feedback relating to the contact made. It is anticipated that this contact force feedback may indicate a level of compression between the contact probe 304 and the device 316, the functionality of a portion/feature of the device 316, and appropriate dimensional movements. Among other things, the contact force feedback offers the benefit of detecting the functionality associated with a device's button movements, including its switching points, by detecting at least one of a resistance, a distance of travel, and a change in resistance during the travel of the end-effector and/or contact probe 304. In can be appreciated that typical switches or buttons tend to offer a first level of resistance when being depressed and a second level of resistance when the switches or buttons make an electrical, mechanical, or other, contact. This resistance change is built into devices, switches, and buttons, to offer tactile feedback to a user, and as such may be tested with the tactility module 116 of the universal device multi-function test apparatus 100.

In some embodiments, the apparatus 100 may include at least one contact probe 304 as, or attached to, an end-effector to interface with one or more devices 316 during testing. Essentially, the contact probe 304 can act as a finger to actuate buttons, move switches, and even interface with capacitive touch and/or resistive touch screen devices. In one embodiment, the contact probe 304 may be configured to move in a direction 314 toward and/or away from a device 316 in a device nest 112. The contact probe 304 may be configured such that it can be quickly removed and replaced from an end-effector or mount associated with the tactility module 116. In some embodiments, the contact probe 304 may comprise a material that is prone to wear and/or deformation over time. Accordingly, a quick changeover would be desired in cases where the contact probe 304 may become worn, damaged, and/or otherwise deformed. Although the changeover of the contact probe 304 may be performed manually, it is anticipated that the system may include one or more quick changeover features that are configured to aid in an automatic changeover operation.

In some embodiments, the contact probe 304 may be configured to perform all contact-based testing functions. For instance, some embodiments of the probe 304 are designed to include capacitive, resistive, and physical contact features. Additionally, the probe 304 may utilize one or more stress/strain and/or force detection sensors 308. These one or more sensors 308 may be included associated with the contact probe 304 and electrically connected to the apparatus. Additionally or alternatively, multiple probes 304 may be designed that are configured to perform one or more functions of testing. In some instances, the contact probe 304 may be exchanged based on the type of device 316 and/or the type of function to be performed. For example, a contact probe 304 may comprise a compliant capacitive touch sensitive surface and as such may be used to perform capacitive-touch functions of a device display. In another example, a rigid interchangeable contact probe 304 may be used to interface with a resistive touch device and/or manipulate physical switches and the like.

The contact probe 304 may be sized to a particular application and/or function. However, it should be appreciated that the probe 304 can be configured as a standard size to accommodate all devices and testing function of the universal device multi-function test apparatus 100. In one embodiment, the contact probe 304 may be configured with a minimum amount of material at a contact probe tip 312 that a touch-screen (capacitive touch) can detect. As can be appreciated, a minimum standard size of the contact probe tip 312 can be determined as long as the tip 312 is capable of functioning with a device 316 having the least sensitivity.

Figure 4:
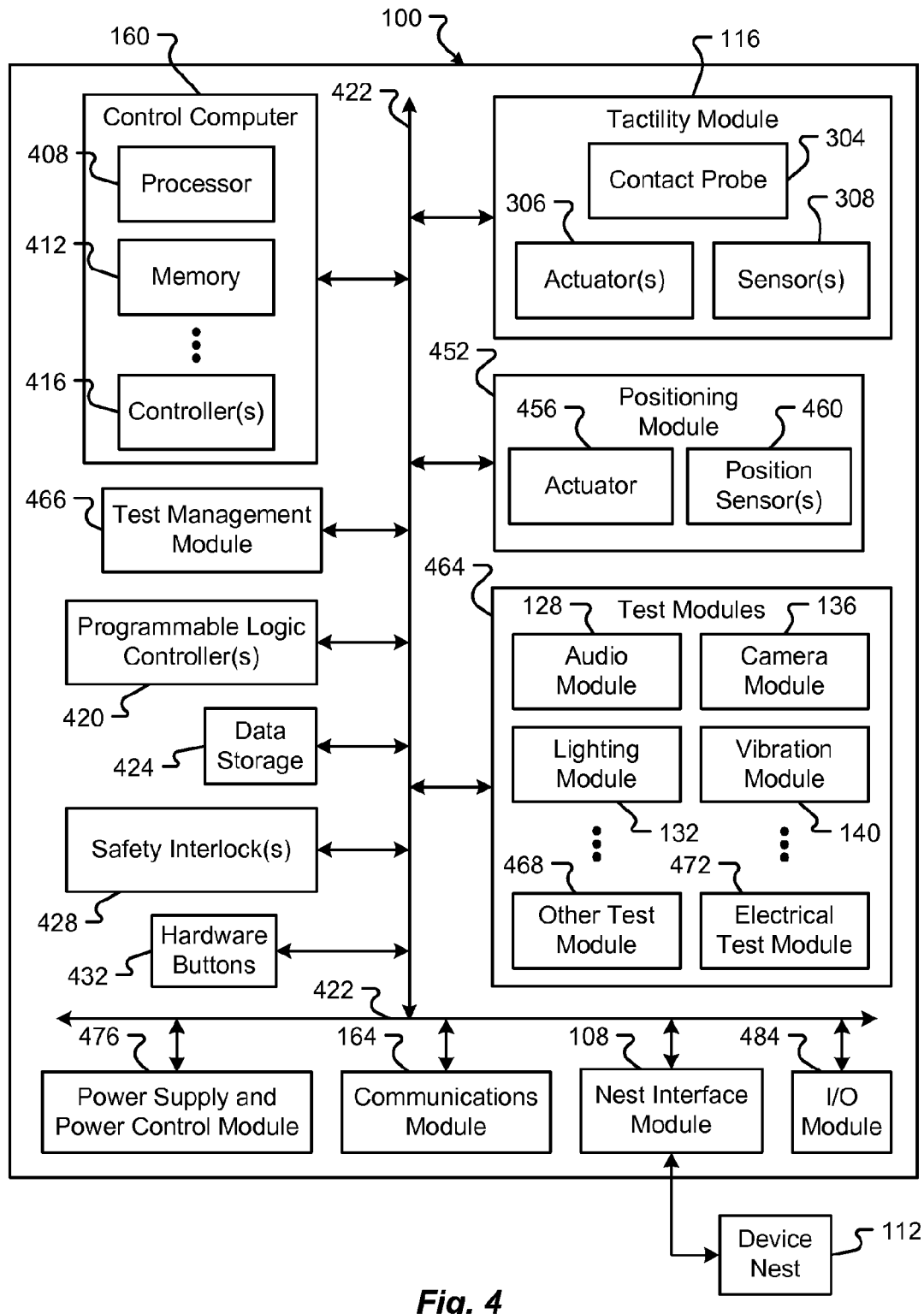
FIG. 4 is a block diagram of an embodiment of the hardware of the universal device multi-function apparatus.

FIG. 4 illustrates components of a universal device multi-function apparatus 100 in accordance with embodiments of the present disclosure. In general, the apparatus 100 includes a control computer 160, a nest interface module 108, a tactility module 116, various test modules 464, a test management module 466, a modular expansion, or equipment, bus 422, and a communications module 164. Embodiments of the nest interface module 108 and tactility module 116 are provided above.

The control computer 160 may comprise a processor 408, a memory 412, and at least one controller 416. The processor 408 may comprise a general-purpose programmable processor or controller for executing application programming or instructions. In accordance with at least some embodiments, the processor 408 may include multiple processor cores, and/or implement multiple virtual processors. In accordance with still other embodiments, the processor 408 may include multiple physical processors. As a particular example, the processor 408 may comprise a specially configured application specific integrated circuit (ASIC) or other integrated circuit, a digital signal processor, a controller, a hardwired electronic or logic circuit, a programmable logic device or gate array, a special purpose computer, or the like. The processor 408 generally functions to run programming code or instructions implementing various functions of the apparatus 100.

A control computer 160 may also include memory 412 for use in connection with the execution of application programming or instructions by the processor 408, and for the temporary or long term storage of program instructions and/or data. As examples, the memory 412 may comprise RAM, DRAM, SDRAM, or other solid-state memory.

One or more controllers 416 may be provided for controlling the operation of the various apparatus 100 modules 116, 164, 452, 464. In accordance with alternate embodiments, a common or shared module controller 416 may be used to control each of the included modules. In accordance with still other embodiments, the functions of a controller 416 may be incorporated into other components, such as a processor 408.

The apparatus 100 may include one or more programmable logic controller(s) (PLC) 420 for controlling a sequence of operations provided by one or more of the apparatus 100 modules. In some embodiments, one or more of the test modules 464 may incorporate its own PLC 420, which can be programmed to perform motion control, sequential operation control, and process control.

In some embodiments, the apparatus 100 may utilize data storage 424. Like the memory 412, the data storage 424 may comprise a solid-state memory device or devices. Alternatively or additionally, the data storage 424 may comprise a hard disk drive or other random access memory. Among other things, the data storage 424 may be utilized by the apparatus 100 to store test results, procedures, standards, and the like associated with one or more devices 316.

The apparatus 100 may incorporate one or more safety interlocks 168 to prevent access to one or more moving parts, test areas, and hazardous elements of the apparatus 100. It is anticipated that certain safety interlocks 168, can be overridden by running the apparatus 100 in a "maintenance/service" mode. For example, a switch of the apparatus 100 may be activated or deactivated via software and/or hardware to operate the apparatus 100 in a mode where one or more safety interlocks 168 are disabled for at least a temporary period of time. This service mode of operation can allow a qualified technician to observe faults, or make repairs, to the apparatus 100 while it is in an operational condition.

Hardware buttons 432 can be included for example for use in connection with certain control operations. In some embodiments, the hardware buttons 432 can be configured for specific inputs. For example, the hardware buttons 432 may be configured to, in combination or alone, control a number of aspects of the apparatus 100. Some non-limiting examples include, system power, test initiation, test termination, emergency stop, etc. In one embodiment, the function associated with a hardware button 432 may change depending on a state of operation of the apparatus 100. For instance, while the apparatus 100 is performing a calibration routine, an input provided at a test termination button may skip the calibration routine, refer to memory, and may proceed to the next test in sequence.

In some embodiments a positioning module 452 may be included comprising at least one actuator 456 and at least one position sensor 460. One or more of the modules 116, 464 of the apparatus 100 may be attached to the positioning module 452, and may be moved from one location to another in the apparatus 100. For example, a camera module 136 may be attached to the positioning module 452 for positioning adjacent to a device 316 under test. The positioning module 452 may move the camera module 136 relative to a location of the device 316 in an X, Y, and Z, or three-dimensional, coordinate system. As can be appreciated, the positioning module 452 may be a combination of actuators, stages, motors, screws, robotic arms, and the like. Alternatively or additionally, the nest interface module 108 may be operatively attached to the positioning module 452 to move relative to test equipment or modules 116, 464 that can remain attached to the apparatus 100.

The apparatus 100 may include a communications module 164 to facilitate communications across a network. In some embodiments, the communications module 164 may be configured to accommodate wired and/or wireless communications. As examples, the other communications module 164 can comprise a Wi-Fi, BLUETOOTH™, WiMax, infrared, or other wireless communications link. The communications module 164 can be associated with a shared or a dedicated antenna.

Communications between various components of the apparatus 100 can be carried by one or more buses 422. In addition, power can be supplied to the components of the apparatus 100 from a power supply and/or power control module 476. The power control module 476 can, for example, include a battery, an AC to DC converter, power control logic, and/or ports for interconnecting the apparatus 100 to an external source of power. In some embodiments, the power to the device under test may be controlled. For instance, current, voltage, resistance, and power may be measured and event compared to acceptable limits.

An input/output (I/O) module 484 and associated ports may be included to support communications over wired networks or links, for example with other universal device multi-function test apparatuses, servers, and/or peripheral devices. Examples of an input/output module 484 include an Ethernet port, a Universal Serial Bus (USB) port, Institute of Electrical and Electronics Engineers (IEEE) 1394, or other interface.

The test modules 464 may include one or more modules configured to perform tests on an electronic device 316 in the device nest 112. Each of the test modules 464 may perform a test on a device 316 alone or in combination with another of the test modules 464. In one example, one or more of the modules 128, 132, 136, 140, 468 may be configured to operate simultaneously, or in concert with, another of the test modules 464 to achieve a test result. Additionally or alternatively, each of test modules 464 may be run in a sequence to gather test result data. As disclosed herein, the test result data may be written to apparatus 100 memory (e.g., data storage 424), device nest memory 210, facility data storage, and/or test data storage across a communications network. Each test module may include a test routine, and/or test sequence, that can perform at least one test associated with each module.

Among the test modules 464 included in the apparatus 100, an audio module 128 may be provided to determine the functionality of a device's audio input and/or output components. In some embodiments, an audio module 128 may comprise an acoustic receiver and/or source. The audio module 128 may be oriented in various positions (or distances) from the device 316. This variation of position may be achieved by an actuator attached to the audio module 128. For example, an audio input of a defective device 316 may detect audio inputs at close range, but may not at further distances. Among other things, this defect may be detected by operating an audio module 128 while increasing the distance between the device 316 and the audio module 128. For instance, the audio module 128 may be attached to an actuator that operates to increase the distance from a fixed testing-position of a device 316. Alternatively, the device 316 or device nest 112 could be actuated into various positions from a fixed audio module 128.

In another embodiment, the apparatus 100 may include one or more lighting modules 132. Some of the lighting modules 132 may be configured to provide ambient lighting. Other lighting modules 132 may be configured to provide directional lighting adjacent to and/or onto the device 316. This lighting may be used to inspect and/or test various sensors and/or components associated with the device 316. For instance, a lighting module 132 may be activated at various levels of intensity/brightness. In combination with the camera module 136, the apparatus 100 can detect the functionality of the screen-dimming sensor of a device 316, especially at varying levels of light exposure. This test may be performed by adjusting the light intensity of one or more light modules 132 and monitoring the response electrically through the electrical connection to the device 316. In another embodiment, the test may be performed by adjusting the light intensity of one or more light modules 132 and monitoring the response visually through the camera module 136 of the apparatus 100 monitoring a display of the device 316. Other inspections utilizing the lighting modules 132 may include surface defect inspection, screen imperfection detection, visual defects, and more.

In some embodiments, the test modules 464 may include a camera module 136. As disclosed herein, the camera module 136 may utilize lighting provided by the lighting module 132. Additionally or alternatively, the camera module 136 may include its own lighting to illuminate areas of a device 316 under test. The camera module 136 may employ a camera sensor and at least one lens to produce an optimal field of view of an area of the device 316. In one embodiment, the camera module 136 may utilize a video camera system configured to produce video images received by the camera sensor. Among other things, the camera module 136 may be used to inspect one or more of screens, displays, casing, visual defects, and/or pixels of a device under test. It is anticipated that the apparatus 100 may provide power and or control signals to the device and any associated components before, during, and/or after testing. As such, the apparatus 100 may activate the display of a device 316 and run a series of pixel/display quality tests. The pixel count, quality, power, and/or functionality may be detected by one or more camera and/or number of other sensors. In some embodiments, the camera sensor of the camera module 136 used to detect pixel information may be configured to view an entire device display in its field of view. The resolution of the camera sensor may equal a number greater than the available number of pixels on a typical device display. For example, a device display configured at 600,000 pixels may be inspected using a 6.0 megapixel camera sensor to ensure optimal measurement resolution accuracy.

In other embodiments, the camera module 136 may be configured to inspect different sections of the device display that, in combination, make up the entire display area. The camera module 136 may be indexed to different areas of the device display via one or more actuators (e.g., Cartesian X-Y, selective compliant assembly robot arm (SCARA) robot, six-axis robot, hexapod stages, piezoelectric positioning system, and other combined actuators). Alternatively, the device 316 and/or device nest 112 may be indexed underneath a fixed camera module 136 using similar actuators. The sections of the device display that are inspected by the camera module may be overlapped to provide redundancy, and/or reliability, of inspection at outlying areas of the camera sensor's field of vision.

In some embodiments, the apparatus 100 may employ the use of a vibration module 140 for testing tactile feedback and/or vibration features of a device 316. In one embodiment, the vibration module 140 can determine functionality and/or failures associated with at least one vibration component of a device 316. For example, a contact probe 304 operatively connected to a sensor 308 may be placed onto the glass of a device 316 (e.g., as close to parallel with the glass surface as possible) and the at least one vibration component of the device 316 may be activated. By measuring how many times the sensor 308 moves in a given time period (e.g., one second), the functionality associated with the at least one vibration component can be determined. In some cases, this technique may be used to determine the RPM of a vibration motor/mechanism of a device 316.

In one embodiment, a sensor 308 may be a part of the end-effector and/or the contact probe 304. For instance, the contact probe 304 may be directed to move adjacent to a surface of the device glass where the probe 304 may detect a specific force that is associated with a type of contact with the device's glass, or other surface. The device's vibration function may be activated, and at least one force sensor 308 of the end-effector and/or the contact probe 304 may detect the vibration caused by the device 316. The at least one force sensor 308 may be configured to detect frequency and/or amplitude of the vibration. Additionally or alternatively, the force sensor 308 may detect the movements per second generated by the device 316. Vibration data collected by the force sensor 308 may be recorded and compared to previously recorded data, gold standards, industry averages, manufacturer specifications, thresholds, and/or limits to determine the functionality of the tested vibration component.

It should be appreciated that the vibration module 140 can determine a functionality associated with different devices 316 and/or various device mechanisms that may be used to generate a vibration. For instance, the vibration module 140 and sensor 308 may detect an eccentric weighted vibration motor, a vibration actuator, an electromagnetic coil and leaf spring configuration, and the like.

In one embodiment, the apparatus 100 may utilize an electrical test module 472 which may send and/or receive one or more signals to and from the device 316 via an electrical interconnection with the device 316. These signals may be provided by an electromechanical or electrical test module 472 that is configured to provide test routines, change operation modes, activate/deactivate features, and present information to be interpreted and returned by the device. It is anticipated that the device 316 may communicate with the apparatus 100 via the universal connection area 232 of the device nest 112 electrical interconnection previously disclosed. In some embodiments, a test routine (or application) may be provided to the device 316 that requires a physical and/or mechanical contact to be made with the device. The universal device multi-function test apparatus 100 may direct the end-effector and/or contact probe 304 to make the physical and or mechanical contact. Once the contact is made, the device 316 may provide an output via the universal connection area 232 to the universal device multi-function test apparatus 100 to provide information relating to the testing routine prompts and responses by the universal device multi-function test apparatus 100. Additionally or alternatively, feedback relating to the performance of the contact made can be output by a machine component other than the device 316 being tested. For example, a camera module 136, or vision system, may observe the physical and/or mechanical movements of the universal device multi-function test apparatus 100 in conjunction with the testing routine and report information relating to the test. It is anticipated that the signals sent and/or received may be performed in real-time, near-real-time, and/or non-real-time.

In another embodiment, the electrical test module 472 may detect various outputs from the device 316, including but not limited to one or more sensors, switches, buttons, keyboards, and screens of the device 316, and verify that a mechanical and/or physical movement has been performed correctly. Additionally or alternatively, the universal device multi-function test apparatus 100 may be configured to run a test routine by physically contacting the device 316 at various locations and then detecting feedback from the device to ensure the physical contact was appropriately made. Feedback may be received and/or analyzed from the device 316 in real-time, near-real-time, or non-real-time. As can be appreciated, the feedback may be analyzed by the universal device multi-function test apparatus, the device, and/or combinations thereof.

In yet another embodiment, the electrical test module 472 may be configured to emulate human tasks. In other words, the electrical test module 472 may be configured to interpret feedback from a device as a human may interpret feedback from a tested device 316. For example, a camera module 136, or vision system, may be utilized by the universal device multi-function test apparatus 100 to determine screen performance and/or failures of a device screen by detecting pixel loss, bright spots, dim spots, and the like. In this instance, the camera module 136 may be alerted that a certain result should happen and the camera module 136 could accordingly verify the result. For example, the camera module 136 may use optical character recognition, vision tools, image capture times and durations, specific fields of view, sensor accuracy, and the like to determine an appropriate output to the screen of a device 316.

The electrical test module 472 may cause specific features of a device 316 to be activated via an electrical interconnection to the apparatus 100. By way of example, the device 316 may be caused to activate a device camera, flash, voice recording, sound playback, video file, audio file, and the like. In one example, the apparatus 100 may test the functionality of a device's camera by causing the device's camera to take a picture of a test image 152. In some cases, the test image 152 can be illuminated by a light plate or other illuminated device or structure. As provided above, the device's camera may be oriented such that the camera sensor has an unobstructed view of a test image 152 through one or more clearance windows 236, 262. Once the image has been recorded, the apparatus 100 may compare the recorded image to a stored image reference. This comparison may determine one or more faults associated with the device camera. Similar electrical functions (e.g., audio and video) and files may be initiated, recorded, and compared to stored references via the control computer 160, and/or the various test modules 464 of the apparatus 100.

The apparatus 100 may include a test management module 466 that is configured to apply and/or arrange a sequence of tests or test modules 464 in the testing of a device 316. In some embodiments, the test management module 466 may include a first sequence of tests or test modules 464 to apply in a device 316 test. For example, the first test sequence may include applying the audio module 128 and its associated tests first, followed by the camera module 136 and its tests, and end by applying the vibration module 140 tests. As each test of each test module 464 is performed, the test modules 464 may communicate with the test management module 466 to provide a response based on the performed test. This response may indicate whether a test performed by a module, or group of test modules 464, has passed, failed, did not complete, and/or provide various levels of feedback regarding the indication. Based on the response provided from one or more of the test modules 464, the control computer 160 may determine to rearrange the test sequence within a test module 464, or rearrange the sequence of test modules 464 applied to the testing of the device 316. When a control computer 160 determines that a test sequence requires a modification, the control computer 160 may instruct a test management module 466, 528 to dynamically modify the test sequence. In one embodiment, a modified sequence of tests and/or test modules 464 may be forwarded to other test apparatuses 100, facilities, and/or a master test management module server across a network.

In some embodiments, the universal device multi-function test apparatus 100 may include a modular test equipment expansion bus 422 to add or remove test modules 464 without costly program and/or apparatus 100 reconfiguration. The modular test equipment expansion bus 422 may be configured as a "daisy-chain" style of interface to add or remove test equipment, including but not limited to one or more sensors, subassemblies, assemblies, components, and combinations thereof. For example, the universal device multi-function test apparatus 100 may utilize a processor/computer to control aspects and/or features associated with the apparatus. This computer can be configured to interconnect to an expansion bus 422 where all of the test equipment, or test modules 464, are attached at a component, subassembly, or assembly level. Upon connecting to the expansion bus, a test module 464 may register with the control computer and provide information relating to the equipment that may be pertinent to control and/or testing. For example, the information may include the type of equipment connected, input/output required, a MAC address (or equivalent) of the equipment, a test routine order or rank (e.g., before vision inspection, after tactile tests), update links, operation and control information, etc. In other words, the test modules 464 connected to the modular test equipment expansion bus 422 register with the control controller 160 and any appropriate controllers 408, 416.

Communication between the test modules 464 connected and the universal device multi-function test apparatus 100 can be achieved via one or more custom and/or standard communications protocols. Moreover, the software and/or firmware associated with the universal device multi-function test apparatus 100 control computer 160 and/or the modular test equipment expansion bus 422 may be upgradeable remotely. In accordance with one aspect of the present disclosure, the universal device multi-function test apparatus 100 may include one or more connections to a network. As disclosed herein the network may include but is not limited to a local area network ("LAN"), a wide area network ("WAN"), a public switched telephone network ("PSTN"), a circuit-switched network, a packet-switched network, the Internet, combinations thereof and the like.

At least one benefit associated with the modular test equipment expansion bus 422 is that it can accommodate for the expansion of tests, test modules 464, and/or test equipment that are not currently in demand and/or not currently developed. In accordance with embodiments of the present disclosure, the apparatus 100 is configured to receive and number of other test modules 468. Among other things, this capability provides expandability for future tests and the like. For example, device screens in the future may incorporate self-healing features. In one embodiment, the screen may need to be contacted (e.g., touched or scraped, etc.) to initiate a self-healing operation. Accordingly, the universal device multi-function test apparatus 100 could incorporate a self-healing screen test and repair assembly that can connect to the modular test equipment expansion bus 422. Once the self-healing screen test and repair assembly (e.g., other test module 468) is connected to and registered with the control computer 160, the self-healing screen test and repair equipment may operate in accordance with existing test procedures. As can be appreciated, the test and repair function may be ordered before or after other tests provided by the universal device multi-function test apparatus 100. In some embodiments, the test and repair equipment may register an update link or connection procedure with the computer. In this case, the other test module 468 and/or test modules 464 may connect to a network to update the universal device multi-function test apparatus 100 and/or self-healing screen test and repair equipment with the latest software and/or firmware.

Figure 5:
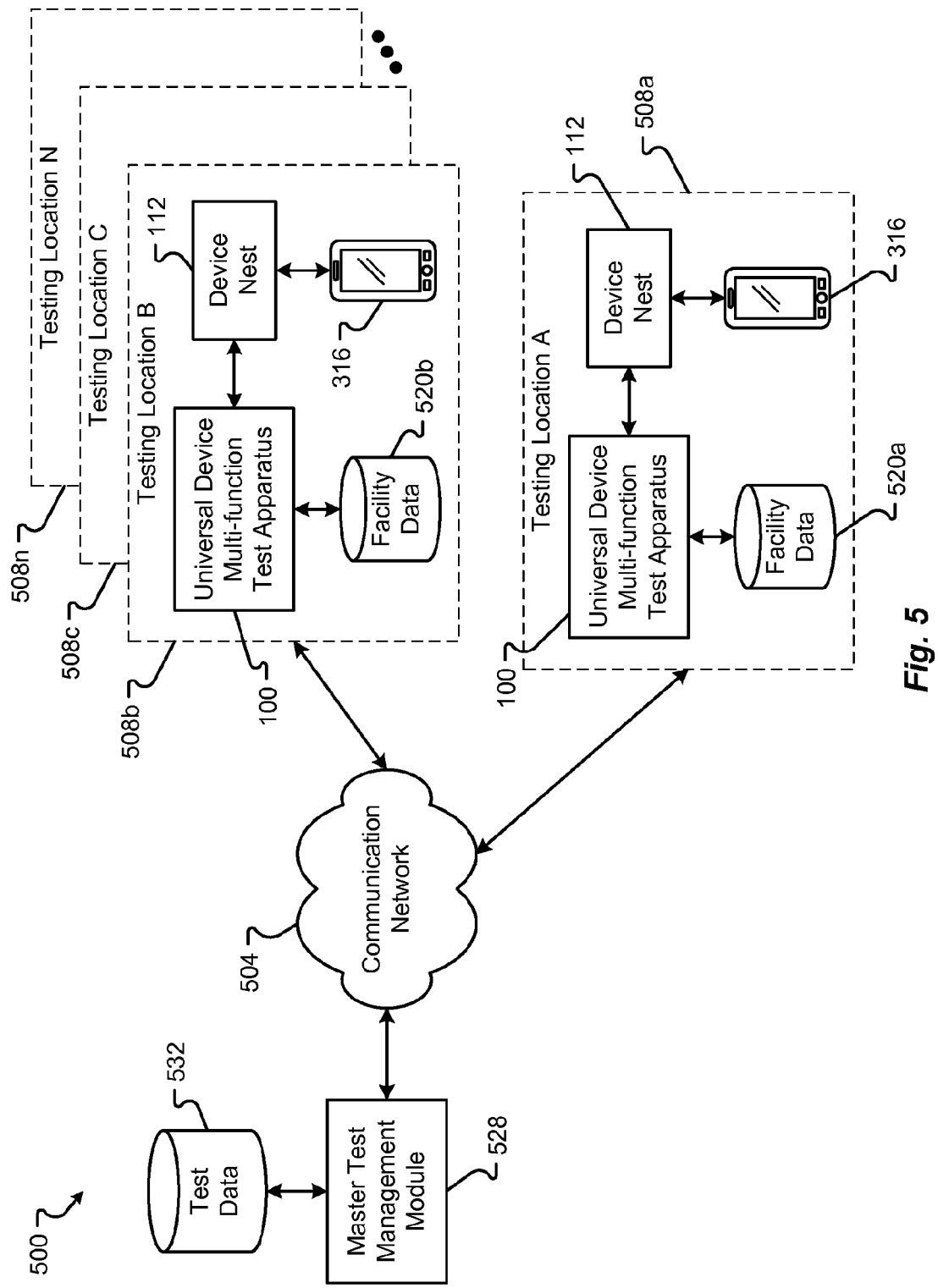
FIG. 5 is a block diagram of a testing network in accordance with embodiments of the present disclosure.

Referring now to FIG. 5, a block diagram of a testing network 500 is shown in accordance with embodiments of the present disclosure. The testing network 500 may include a plurality of testing locations 508*a-n*, a communication network 504, a master test management module 528, or server, and master test data storage 532. Each of the testing locations 508*a-n* may correspond to repair and/or production facilities. It is anticipated that each testing location 508*a-n* may include at least one of an apparatus 100, testing facility data storage 520, a device nest 112, and device 316. In one example, a testing location 508 may include two or more universal device multi-function test apparatuses 100. Continuing this example, the two or more apparatuses 100 may communicate with each other, the facility data 520, and even across a network to a master test management module 528.

As disclosed herein, each apparatus 100 may record test results obtained from one or more tests performed on a device 316. These test results may be stored in one or more of device nest memory 210, data storage 424 of the apparatus, facility data storage 520, and test data storage 532. The test results obtained from a plurality of devices 316, when analyzed, can be used to optimize operations, which may include, refining test procedures, determining apparatus 100 functionality, determining repeat device 316 test failures, predicting a device 316 component and/or assembly life, and even establishing gold standards for subsequent device 316 testing. In an exemplary embodiment, an apparatus 100 may communicate various device 316 test results to a facility data storage 520 and/or across a network 504 to a test data storage 532. Once stored, the test results may be interpreted by a facility computer and/or a master test management module 528 to optimize operations. It is another aspect of the present disclosure that the optimized operations may be communicated to one or more apparatus 100 via the facility computer and/or the master test management module 528. Additionally or alternatively, the test management module 466 of each apparatus 100 may send and receive, or communicate, optimized operations (e.g., modified test sequences, modified test module sequences, etc.) across a network 504. As disclosed herein the communication network 504 may include but is not limited to a local area network ("LAN"), a wide area network ("WAN"), a public switched telephone network ("PSTN"), a circuit-switched network, a packet-switched network, the Internet, combinations thereof and the like.

It is an aspect of the present disclosure that failures may be recorded, tracked, and analyzed to create an intelligent gold standard by which to test and compare devices. This tracked data may be stored in a knowledge database, or memory 412, 424, 520, 532, locally and/or remotely. The information may provide comprehensive information relating to a particular device 316 type, its failure conditions, associated testing criteria, and the like. This information may be analyzed to, among other things, map commonalities between failures and devices 316. Once a threshold, limits, and/or pattern of failures is detected, the gold standard can be developed and implemented in future testing, test operation ordering, and the like.

In some embodiments, the tests and other data collected as a result of the tests may be stored and/or forwarded for further processing. In one instance, this data may be stored and/or written to the device 316 memory. Additionally or alternatively, the data may be accessed via one or more network connection and/or data transfer port. In some embodiments, the apparatus 100 may be networked to other apparatuses 100 and/or a communication network 504. The communication network may facilitate automation control, data transfer, remote access, and more.

In accordance with one aspect of the present disclosure, the testing results of one or more devices 316 may be stored and/or analyzed. These results may be used to refine the "gold" standard testing and threshold requirements of a particular device 316. This adaptive testing routine may provide repair/defect information related to an individual device type, component, series of components and/or group of devices 316. For example, a particular device 316 type may experience a high number of failures in its display components. The device manufacturer may benefit from knowing that the display of their device(s) 316 are failing at a rate above the manufacturer's accepted limits, inside a normal range, and/or above industry norms. This knowledge may allow the device 316 manufacturer to make changes to their supply chain and/or manufacturing process. Alternatively or additionally, it may be determined that a particular type of device 316 experiences higher rejects than others in its class. In any event, the information may be gathered, classified, and/or forwarded for further processing.

By way of example, a specific device manufacturer, "XYZ Corp," may manufacture an electronic device 316 designated model "B1." As various "B1" devices are tested by one or more apparatus 100 (e.g., in a single testing location 508a and/or various testing locations 508b-n), test results may be obtained that suggest the "B1" device fails after the third test in a test sequence. The third test in the test sequence may be associated with a communications ability of the "B1" device. Continuing the example, the test results associated with "B1" may be communicated to a test management module 466 of an apparatus 100, a facility computer, and/or master test management module 528. The test management module 466, facility computer, and/or master test management module 528 may analyze the test results and optimize operations associated with the "B1" device. These optimized operations may be communicated to one or more apparatus 100 via the test management module 466, facility computer, and/or master test management module 528 for subsequent "B1" device testing. For instance, the optimized operations may restructure the test sequence such that test three is performed first in sequence on all "B1" devices. Additionally or alternatively, the repeat failures of the communications ability of "B1" devices may be stored in facility data storage 520 or test data storage 532. The repeat failures may be communicated to the device manufacturer "XYZ Corp" to, among other things, identify the failures and isolate problematic suppliers and/or components. The information associated with the test results may include, but is not limited to, component, device, and test apparatus information, revision, make, manufacturer, model number, production date, date of test, and the like.

Figure 6:
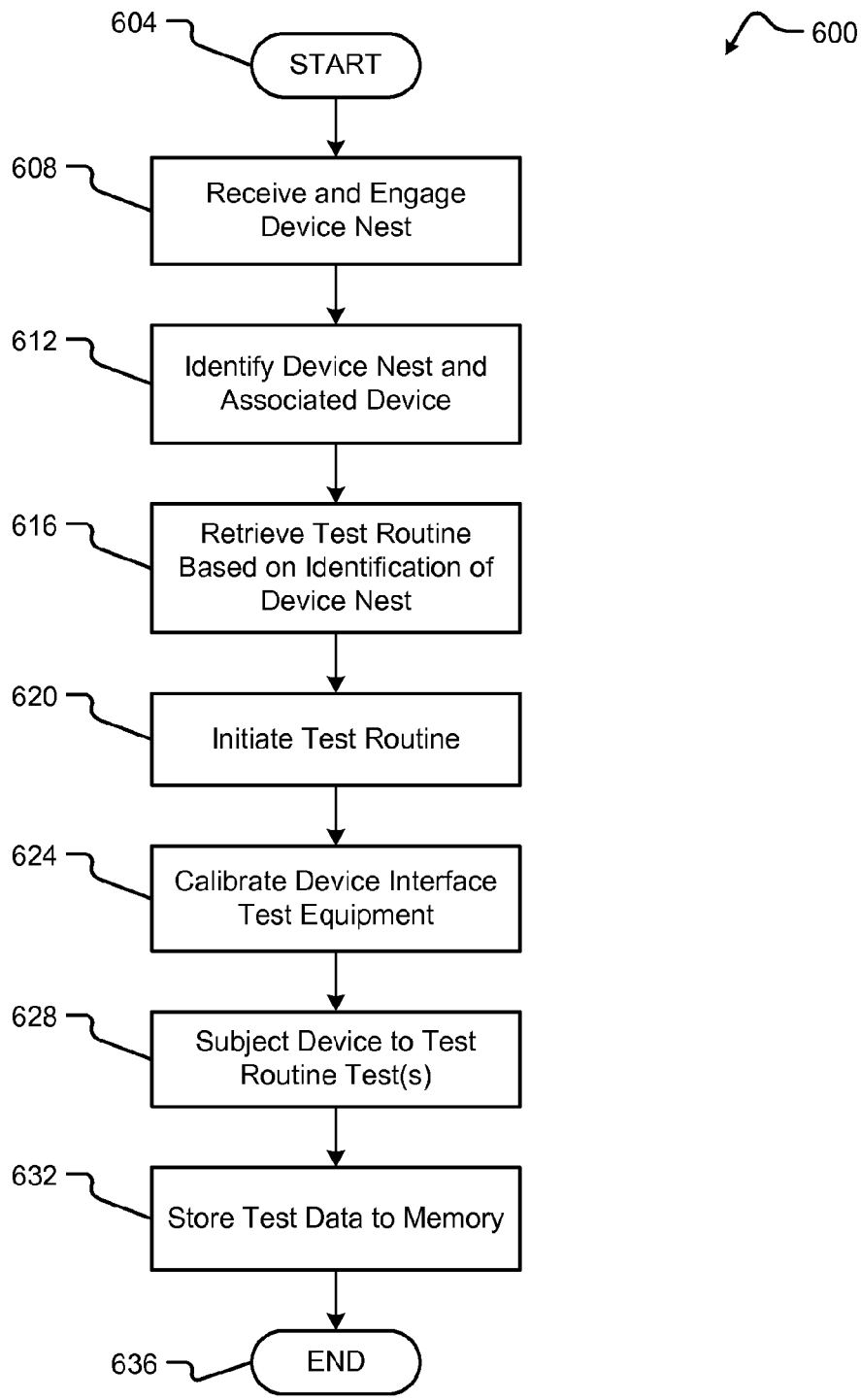
FIG. 6 is a flow diagram depicting a testing method in accordance with embodiments of the present disclosure.

FIG. 6 is a flow diagram depicting a testing method 600 in accordance with embodiments of the present disclosure. The method 600 begins at step 604 and proceeds when the apparatus 100 receives and engages a device nest 112 (step 608). Specifically, a device 316 can be loaded onto a device nest 112, such that the device 316 is at least partially contained by the device nest 112. Containing the device 316 may include orienting the device 316 via one or more location features 208 associated with the device nest 112. Additionally or alternatively, loading the device 316 onto the device nest 112 may include electrically connecting the device 316 to a universal connection area 232 of the device nest 112. Next, the loaded device nest 112 can be loaded onto the nest interface module 108 of an apparatus 100. Once loaded onto the nest interface module 108, the device nest 112 can be actuated into a mechanical and/or electrical engagement with the apparatus 100. An electrical engagement can establish an electrical interconnection between the device 316 and the apparatus 100 and its various components. In some embodiments, the device nest 112 may be moved into an engaged position via at least one actuator associated with the nest interface module 108 and/or the apparatus 100.

The method 600 continues by identifying the device nest 112 (step 612). It is anticipated that the device nest 112, when connected to the universal device multi-function test apparatus 100, can communicate its configuration by informing the universal device multi-function test apparatus 100 what type of device nest 112 and/or device 316 is connected to the device nest 112. In some embodiments, identification of a device nest 112 may be provided by one or more sensors associated with the nest interface module 108 that can detect a portion of the device nest 112, where the portion of the device nest is configured to provide an identifying characteristic. In another embodiment, a device nest 112 may include identification information stored in a memory 210 associated with the device nest 112. Some non-limiting examples of identification information may include, a serial number of the device nest 112, a serial number of a device 316 associated with the device nest 112, a device 316 product type, a device 316 product family, a version number, and the like. Additionally or alternatively, the identification information communicated to the universal device multi-function test apparatus 100 from the nest memory 210 may include, but is not limited to, specific coordinates of one or more calibration features 212 (post, point, area, etc.) of the device nest 112.

Next, the apparatus 100 may retrieve at least one test routine based on the identification of the device nest 112 (step 616). The test routine may be stored in a memory associated with the apparatus. For instance, the test routine may be stored in the control computer memory 412 and/or data storage 424 of the apparatus 100. In some cases, the apparatus 100 may communicate with facility data storage 520 and/or test data storage 532 to retrieve a test routine. Although a test routine may be stored in memory associated with the apparatus 100, stored test routines may be updated by a test management module 466, a facility computer, and/or a master test management module 528. This update of a test routine may be pushed to one or more apparatuses 100 that are in communication with another apparatus 100, a facility computer, and/or master test management module 528.

The method 600 continues by initiating the retrieved at least one test routine (step 620). In some cases, the initiation of a test routine may include referring to a facility computer and/or a test server 532 to verify that a version of a test routine stored in memory is the most current version available. In other words, the apparatus 100 may communicate with a server 532 and check if any updates of the test routine are available. In the event that updates are available, the apparatus 100 may proceed to download the update to memory 408, 424, 520, before performing any tests on the device 316 in the device nest 112.

Included as part of the test routine, the apparatus 100 may determine to calibrate various test modules 116, 452, 464 and or equipment associated with the apparatus 100 (step 624). Calibration may include checking a functionality, determining a presence, and even providing baseline operational criteria, for one or more components associated with the apparatus 100.

The apparatus 100 may employ automatic calibration features to allow the contact probe 304 and/or the tactility module 116 to be calibrated before a testing procedure. Specifically, the X, Y, and Z position, or three-dimensional position, of the contact probe 304 and even the actuator 306 can be verified using one or more features of the device nest 112, the nest interface module 108, and/or the apparatus 100. In one embodiment, the apparatus 100 employs a calibration post 216, 220, or features 212, that the contact probe 304 is designed to reference from. For example, the calibration post 216, 220 may include an inverted cone, drill point, hole, ball, other datum feature, or combinations thereof. This calibration post 216, 220 and feature(s) 212 may be oriented in a position/location that is known from one or more other datum surfaces, points, parts of the device nest 112, and/or combinations thereof. In one embodiment, the one or more other datum surfaces may include a substantially planar surface that contacts at least one surface, edge, line, and/or point on the test piece (i.e., device 316). Other datum references may be created with pins, dowels, balls, slots, holes, surfaces, combinations thereof, and it is anticipated that these datum references may be used to position or otherwise contain a device 316 during testing.

A calibration routine may be programmed to direct the contact probe 304 to at least one datum reference. The probe 304 may then travel to another datum reference to verify positional accuracy in one or more planes. Verification of this position can be achieved via sensors 308 located in or adjacent to the contact probe 304. Additionally or alternatively, the position may be verified via one or more visual sensors and/or cameras (e.g., the camera module 136). In one embodiment, the calibration routine may be configured to direct the contact probe 304 to a single calibration post 216, 220 that may incorporate features to aid in X, Y, and/or Z calibration (e.g., the inverted cone or drill point feature of the calibration post 220 previously described). The calibration test may be run whenever a device nest 112 change is detected. In some embodiments, the calibration test may be run whenever a new device 316 is tested. As can be appreciated, the calibration test may be run in response to detecting a fault that may affect a position of the contact probe 304, end-effector, and/or actuator 306. By way of example, a fault may include but is not limited to, an interruption in actuator 306 travel, a detected force above a predefined threshold, a failure to move to a position, combinations thereof, and the like. Calibration may be critical to maintaining accurate force feedback that is used in failure analysis of a device 316, especially of physical buttons, switches, and the like. Most automation solutions have neglected to incorporate calibration features in a high-speed testing apparatus, especially in scenarios employing such a wide variability in a test product range, and as such repeatability, accuracy, and analysis in traditional systems could not be reliably achieved.

Next, the apparatus 100 subjects the device 316 to one or more test routine tests (step 628). As provided above, these tests may include a combination of hardware and/or software tests designed to determine a level of functionality associated with the device 316. The tests may provide pass or fail data regarding a device 316 and/or the components that compose a device 316. In one embodiment, the test data may specifically identify a level of functionality associated with each component of a device 316, and in some cases, the test data may include a comparison of the level of functionality with other tested devices 316 and or a functionality threshold.

The method 600 continues by storing test data to memory (step 632). Test data may include test results, test sequences run, partial or full completion of tests, an identification of components of the device 316 that have passed and/or failed tests, etc. In some embodiments, the test data may be stored to a memory 412, 424 associated with the apparatus 100. Additionally or alternatively, the test data may be stored to facility data storage 520 and/or test data storage 532 across a network 504.

In yet another embodiment, test data may be stored to the memory 210 of the device nest 112. Test data that is stored to nest memory 210 may be unique, compressed, and/or reduced in size from test data that is stored to other memory locations. For example, a device nest 112 loaded with a device 316 may be tracked as it proceeds through a repair or production facility. As the device nest 112 reaches specific routing decision points in an automated facility, the memory 210 of the device nest 112 may be referred to by one or more components associated with the facility automation. The memory 210 may contain routing information pertinent to the automated decision point. For example, if a device 316 failed a series of tests performed by an apparatus 100, the memory 210 may include "fail" routing decisions in its test data. When a failed device 316 reaches a routing decision point, the failure routing decision in the test data may cause the device 316 to be directed to a failure area of the facility. In some embodiments, the routing decisions may include "pass" decisions that cause a passing device 316 to be directed to a pass area of the facility. The method 600 ends at step 636.

Figure 7:
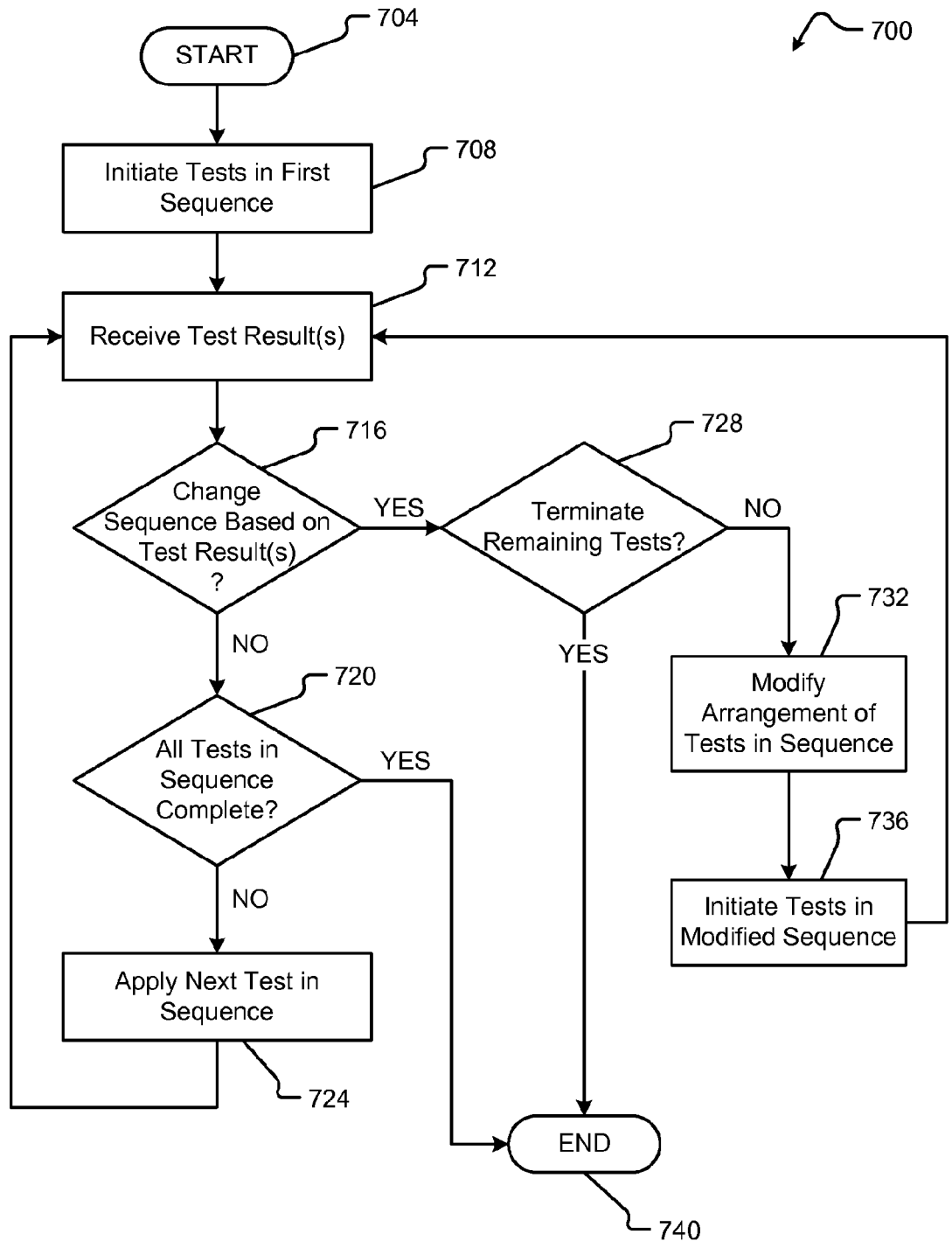
FIG. 7 is a flow diagram depicting a dynamic ordering testing method in accordance with embodiments of the present disclosure.

FIG. 7 is a flow diagram depicting a dynamic ordering testing method 700 in accordance with embodiments of the present disclosure. The method 700 begins at step 704. In some embodiments, the dynamic ordering testing method 700 disclosed herein may correspond to a detailed disclosure of steps 620 and/or 628 previously provided in association with FIG. 6. In one embodiment, the tests may be arranged to determine a state of functionality associated with the tested device 316.

The apparatus 100 can subject a device 316 to a series of tests ordered in a first sequence (step 708). This test sequence may be developed to test a device 316 in accordance with testing speed, reliability, failure considerations, device standards, testing history, test module capabilities, and combinations thereof. As provided herein, one or more test sequences may be stored and run via the test management module 466. In some cases the tests may be provided in a first sequence in a random order.

Next, the test management module 466 of an apparatus 100 receives results from the one or more tests arranged in the first sequence (step 712). Test results may include device and/or component pass/fail indications, functionality levels, test routine sequence, tests applied, combinations thereof and the like. The results may be communicated to a test management module 466, and/or a control computer 160, of the apparatus 100 via one or more test modules 464 and associated equipment 116, 452. Additionally or alternatively, as tests are performed by the apparatus 100 and test results are obtained, the results of those tests may be received by the test management module 466, and/or the control computer 160, in real-time, near-real-time, or non-real-time.

The method 700 continues by the control computer 160 determining whether to change the test sequence based on the test results received (step 716). In some embodiments, the tests may be arranged dynamically and altered in accordance with data received from at least one test of a device 316. For example, the control computer 160 may determine that the device is in a state of total disrepair in which case it may be subjected to only a few key tests. However, the testing may continue if the device is determined to be repairable. Alternatively, the device testing may be terminated if it is determined that the device cannot be repaired (e.g., when it is determined that replacement is more cost effective than repair). As can be appreciated, it is advantageous to structure the testing performed by the apparatus 100 to decrease the amount of time invested in testing devices 316 that may be irretrievably damaged or defective.

In the event that the control computer 160 determines not to change the test sequence, the method 700 continues by determining whether all of the tests in the test sequence have been completed or applied (step 720). If all of the tests in the test sequence have been applied the method 700 ends (step 740). If one or more tests in the test sequence remain, the method 700 continues to apply the next test in sequence (step 724).

In the event that the control computer 160 determines to change the test sequence based on the results of one or more tests, the method 700 continues by determining whether to terminate any remaining tests in the sequence (step 728). As a number of tests used in testing a device 316 increases, so does the time and expense associated with administering those tests via the various components of an apparatus 100. As can be appreciated, some devices 316 may suffer from irreparable failures. Continuing to subject devices 316, which are found to have one or more irreparable failures, to subsequent tests can monopolize the valuable resources of an apparatus 100 with little benefit from the continuing the subsequent tests. For example, a device 316 may have an irreparable display, display driver, and processor. Any one of these failures, alone or in combination, may direct that the device 316 should be routed to scrap. For instance, the cost to repair the device 316 may be substantially more than the cost of replacement. In any event, the device 316 testing may be terminated if it is determined that the device 316 cannot be repaired or that replacement is more cost effective than repair. If it is determined that the remaining tests should be terminated, the method 700 ends (step 740).

In some embodiments, the control computer 160, a test management module 466 of a universal device multi-function test apparatus 100, or a master test management module 528, may intelligently and dynamically order test operations to, among other things, adjust testing routines based on observed criteria (e.g., received test results and/or data). In other words, the arrangement of tests in the test sequence may be modified (step 732). For example, a test management module 466, 528, in response to instruction received from a control computer 160, may arrange tests in a sequence based on which tests involve the highest number of failures observed in a device 316 first. Additionally or alternatively, the order of test operations performed on a device 316 may be dynamically changed to address gross failure conditions first. In one instance, the logic board of a device may be irretrievably damaged and as such it may not be a wise use of resources to run screen and/or button tests before detecting the logic board functionality. As such, a control computer 160 may determine and instruct a test management module 466, 528 may to run the logic board functionality test first.

In another embodiment, the tests may be ordered based on a device's maturity in its product lifecycle. For example, greater failures are expected from first revision products, and those that were manufactured as first releases. Additionally or alternatively, it may be determined that specific releases have specific failures associated with them. In this case, a first release may fail due to a majority of logic board problems, while a second release may fail due to screen failures, etc. It is anticipated that the order of testing operations can be adjusted, or modified, based at least in part based on this knowledge. In addition or in the alternative, the information indicating a specific type of failure relating to a brand, product line, manufacturer, product lifecycle, and more can be tracked by the universal device multi-function test apparatus 100, facility computer, and/or a remote master test management module 528, and as such may be stored remotely, and/or locally.

In yet another embodiment, the tests may be arranged based on the age of a device 316 in use. For example, a device 316 in use for two or three weeks will see different failures than a device that has been in use for a number of years. As can be expected a device 316 that has been in use for a greater amount of time may exhibit failures due to components of the device 316 wearing out. In contrast, a newer (or less used) device 316 may exhibit more manufacturing (e.g., first-run) failures. Accordingly, the tests may be structured to run the most pertinent tests first based on this information. Similar to the information disclosed above, tracking may be performed by the universal device multi-function test apparatus 100, a facility computer, a remote master test management module 528, a database or test data storage 532, and the like.

Once the tests in the sequence have been modified, the method 700 continues by initiating the tests in the modified sequence (step 736). The method 700 may then continue by receiving test results from the modified sequence (step 712), until the method 700 ends at step 740. In some embodiments, the modified sequence may be stored to memory for subsequent testing of identical, or similar, devices. The memory may be associated with one or more of an apparatus 100, facility data storage 520, or test data storage 532.

Figure 8:
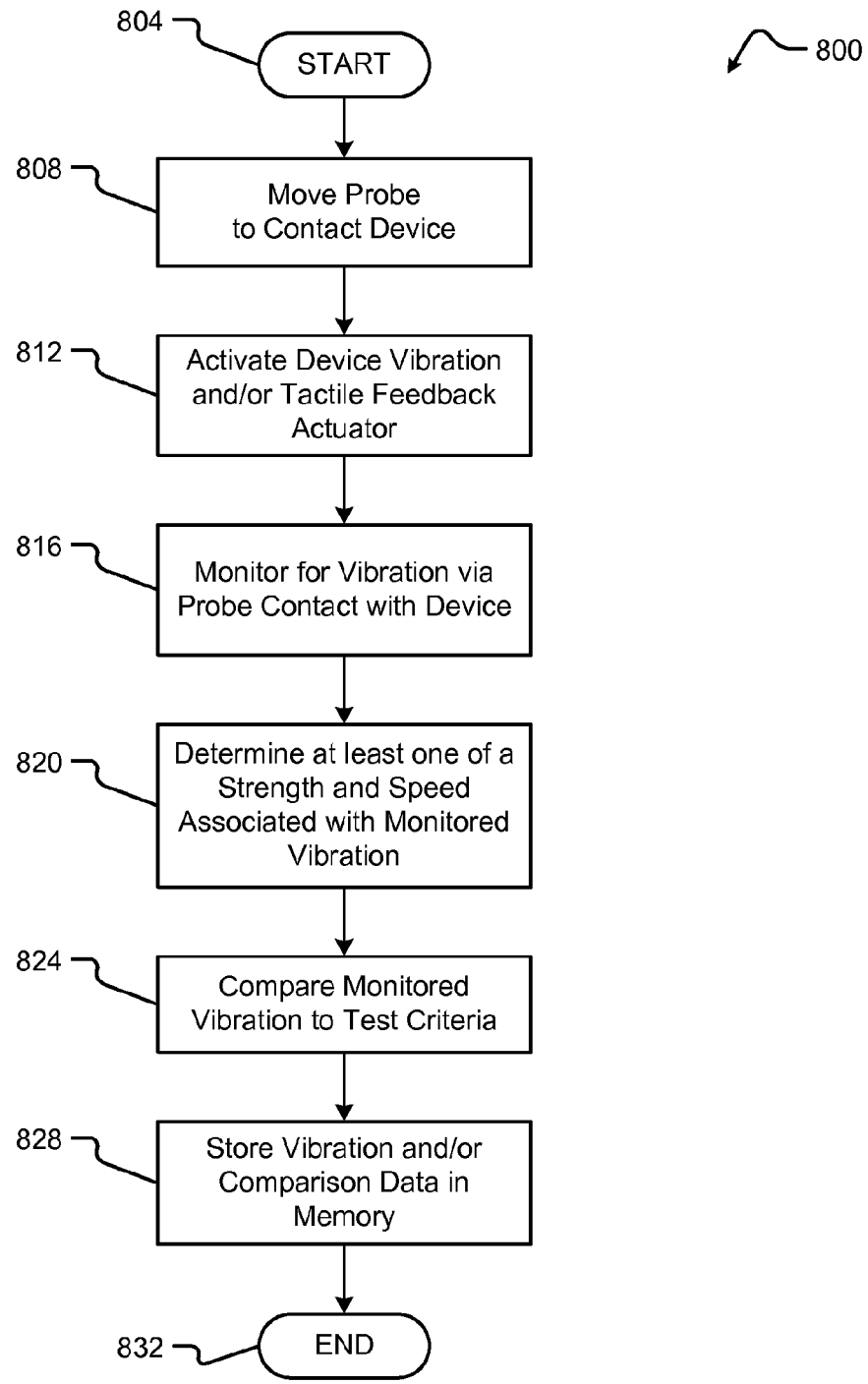
FIG. 8 is a flow diagram depicting a vibration testing method in accordance with embodiments of the present disclosure.

Referring to FIG. 8, a flow diagram depicting a vibration testing method 800 is shown in accordance with embodiments of the present disclosure. The method 800 begins at step 804. Vibration testing may include testing the tactile feedback and/or vibration features of a device 316. In one embodiment, the vibration testing may be performed by a tactility module 116 and a contact probe 304. It is anticipated that the vibration testing method 800 can determine functionality and/or failures associated with at least one vibration component of a device 316. The vibration testing method 800 may be performed by a tactility module 116 as one or more tests in a sequence of tests provided by the apparatus 100.

While a device 316 is in a device nest 112 and engaged with the apparatus 100, a contact probe 304 operatively connected to a sensor 308 may be moved into a position such that it contacts a portion of the device 316. In one example, the contact probe tip 312 may contact a surface of the device 316 (e.g., as close to parallel with the glass surface as possible). In an alternative embodiment, the nest interface module 108 may include one or more sensors that can detect a mechanical energy emitted by the device 316. Contact between the contact probe 304 a portion of a device 316 can be ensured by monitoring an increase in force from the operatively connected sensor 308.

Next, the vibration component and/or tactile feedback actuator of the device 316 is activated (step 812). In one embodiment, activation of the vibration component and/or tactile feedback actuator may be caused by an electrical signal provided to the device 316 via the apparatus 316. In other words, the apparatus 100 may communicate through an electrical interconnection between the device 316, the device nest 112, and the nest interface module 108. Additionally or alternatively, the at least one vibration component of the device 316 may be activated by the contact probe 304 interfacing with one or more hardware buttons, or a touch-sensitive display, of the device 316.

The method 800 continues by monitoring for a vibration (e.g., mechanical or electromechanical energy) provided by the device 316. The monitoring may be achieved by determining a vibration by at least one sensor 308 that is operatively connected to the contact probe 304 which is in contact with at least a portion of the device 316. Any vibration or mechanical energy can be transmitted by the contact probe 304 to the at least one sensor 308 to determine movement of the device 316. By measuring how many times the sensor 308 moves in a given time period (e.g., one second), a functionality associated with the at least one vibration component can be determined. In some cases, this technique may be used to determine one or more of the RPM and acceleration of a vibration component, motor, or mechanism of a device 316.

Upon activating the vibration component and/or tactile feedback actuator of a device 316, the method 800 can be used to determine at least one of a strength and speed associated with the monitored vibration (step 820). The at least one sensor 308 (e.g., force, stress, strain, pressure, etc.) may be configured to detect frequency and/or amplitude of the device 316 vibration. Additionally or alternatively, the sensor 308 may detect the movements per second generated by the device 316. In the event that the sensor 308 does not detect a vibration, the apparatus 100 may determine that the vibration functionality of a device 316 has failed.

Monitored vibration may be compared to vibration test criteria to determine pass/fail criteria and/or a level of functionality associated with a vibration component and/or tactile feedback actuator (step 824). Test specifications for a device 316 may be stored in a memory, as disclosed herein, as a baseline of functional levels of a device's components. During or after a test is performed on a device 316, these test specifications may be compared to test results obtained to evaluate the device. For example, a device 316 may have a manufacturer's vibration component specification that states the vibration feature has a specific frequency, amplitude, and acceleration. When the vibration component of a device 316 of that type is tested, the test results of frequency, amplitude, and acceleration may be compared to those contained in the specification. Comparison data may be generated as a result of this comparison.

Next, the method 800 continues by storing the vibration data and/or comparison data to memory (step 828). In some embodiments, the vibration data may include comparison data. In any event, the data may be stored to a memory 412, 424 associated with the apparatus 100. Additionally or alternatively, the data may be stored to facility data storage 520 and/or test data storage 532 across a network 504. Vibration data collected by the apparatus 100 may be recorded and compared to previously recorded data, gold standards, industry averages, manufacturer specifications, thresholds, and/or limits to determine the functionality of the tested vibration component.

In yet another embodiment, the vibration data may be stored to the memory 210 of the device nest 112. Vibration data that is stored to nest memory 210 may be unique, compressed, and/or reduced in size from test data that is stored to other memory locations. For example, a device nest 112 loaded with a device 316 may be tracked as it proceeds through a repair or production facility. As the device nest 112 reaches specific routing decision points in an automated facility, the memory 210 of the device nest 112 may be referred to by one or more components associated with the facility automation. The memory 210 may contain routing information pertinent to the automated decision point. For example, if a device 316 failed a vibration test, the memory 210 may include "fail" routing decisions in its vibration data. When a failed device 316 reaches a routing decision point, the failure routing decision in the vibration data may cause the device 316 to be directed to a failure area of the facility. In some embodiments, the routing decisions may include "pass" decisions that cause a passing device 316 to be directed to a pass area of the facility. The method 800 ends at step 832.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a Personal Computer (PC), laptop, netbook, smart phone, Personal Digital Assistant (PDA), tablet, etc., or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In some embodiments, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and/or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A system for testing an electronic device, comprising:
   two or more test apparatuses, each test apparatus comprising:
   a processor;
   a memory coupled with and readable by the processor and storing instructions that, when executed by the processor, causes the processor to:
   communicate with multiple testers in the system, wherein each of the multiple testers performs a test of at least one of an operation and a characteristic of the electronic device and outputs a result of the test performed;
   direct the multiple testers to perform a series of tests of the electronic device ordered in a first test sequence;
   receive results of each test in the series of tests performed in the first test sequence;
   determine whether the results of each test in the series of tests performed in the first test sequence indicates a pass or a failure associated with each test performed;
   determine to modify an order of the series of tests in the first test sequence for subsequent tests performed by the multiple testers when at least one result of each test performed is indicated as a failure result, wherein the modification to the series of tests in the first test sequence orders a test that is associated with the failure result before other tests associated with passing results in the first test sequence; and
   store, in the memory, a modified first test sequence comprising the modification to the series of tests in the first test sequence determined; and
   a master test management server in communication with the two or more test apparatuses, wherein the master test management server receives a modified first test sequence determined from a first test apparatus of the two or more test apparatuses and a modified first test sequence determined by a second test apparatus of the two or more test apparatuses, wherein the master test management server analyzes the modified first test sequences received from each of the two or more test apparatuses, determines a failure result associated with a same test performed in each of the modified first test sequences and forwards a standard modified first test sequence including the same test arranged first in the series of tests performed to at least one other test apparatus of the two or more test apparatuses.

2. The system of claim 1, wherein the modification to the first test sequence includes altering a sequence of tests to be performed by the multiple testers.

3. The system of claim 1, wherein the first test apparatus forwards the modified first test sequence determined by the first test apparatus of the two or more test apparatuses to a third test apparatus in a testing network, wherein the third test apparatus is in a testing location that is different from a testing location of the first test apparatus.

4. The system of claim 3, wherein the modified first test sequence is forwarded across a communications network via a wireless communications antenna of the first test apparatus.

5. The system of claim 1, wherein each of the multiple testers includes at least one of an acoustic receiver, an ambient light source, a camera sensor, a vibration sensor, and an electrical test interconnection, wherein the electrical test interconnection electrically interconnects the electronic device with the system and sends and receives data to and from the electronic device, wherein at least a portion of the data sent to the electronic device controls a function associated with the electronic device.

6. The system of claim 5, wherein each test apparatus further comprises:
a contact probe;
an actuator operatively coupled to the contact probe, wherein the actuator moves toward and away from a portion of the electronic device; and
a sensor operatively coupled to the contact probe, wherein the sensor detects a force transmitted by the contact probe when contacting the portion of the electronic device.

7. The system of claim 6, wherein the function controlled by the data sent to the electronic device is at least one of a vibration feature and tactile feedback feature of the electronic device, and the sensor detects a vibration generated by the electronic device.

8. The system of claim 1, wherein each test apparatus further comprises:
a device nest, the device nest that receives the electronic device, and wherein the device nest is adapted to removably connect to each test apparatus.

9. The system of claim 8, wherein each test apparatus further comprises:
a nest interface, wherein the device nest removably connects to each test apparatus via the nest interface and the nest interface provides a mechanical and electrical connection between the device nest and each test apparatus.

10. The system of claim 9, wherein the device nest includes an expanded universal electrical connection area configured to adapt an electrical connection of the electronic device to an electrical connection of the nest interface.

11. The system of claim 9, wherein the device nest includes at least one location feature that positions the electronic device in the device nest.

12. The system of claim 9, wherein the device nest includes at least one calibration feature that a contact probe contacts to determine a position of the contact probe relative to at least one of the device nest and the electronic device.

13. The system of claim 1, wherein each test apparatus of the two or more test apparatuses further comprises:
an electrical interconnection between the processor and the electronic device, wherein one or more functions of the electronic device are controlled by the processor.

14. The system of claim 1, wherein each test apparatus further comprises: a modular equipment bus configured to provide at least one of power and data transfer to the multiple testers and wherein the processor and the multiple testers are operatively coupled to the modular equipment bus.

15. The system of claim 1, wherein each of the multiple testers includes a camera sensor and at least one lens that produces a field of view of an area of the electronic device.

16. The system of claim 1, wherein each of the multiple testers includes an acoustic source.

17. A system for testing electronic devices, comprising:
a plurality of test apparatuses in communication with one another, wherein each of the plurality of test apparatuses comprises:
a processor;
a memory coupled with and readable by the processor and storing instructions that, when executed by the processor causes the processor to:
communicate with a tester that tests one or more of an operation and characteristic of the electronic devices and output a result of each test performed;
direct the tester to perform a series of tests of the electronic device ordered in a first test sequence;
receive results of each test in the series of tests performed in the first test sequence;
determine whether the results of each test in the series of tests performed in the first test sequence indicates a pass or a failure associated with each test performed;
determine to modify an order of the series of tests in the first test sequence for subsequent tests performed by the tester when at least one result of each test performed is indicated as a failure result, wherein the modification to the series of tests in the first test sequence orders a test that is associated with the failure result before other tests associated with passing results in the first test sequence; and
store, in the memory, a modified first test sequence comprising the modification to the series of tests in the first test sequence determined; and
a master test management server in communication with the plurality of test apparatuses, wherein the master test management server receives each modified first test sequence determined by each of the plurality of test apparatuses, wherein the master test management server analyzes each modified first test sequence received from each of the plurality of test apparatuses, determines a failure result associated with a same test performed in each of the modified first test sequences and forwards a standard modified first test sequence including the same test arranged first in the series of tests performed to one or more other test apparatuses of the plurality of test apparatuses.

18. A method of dynamically ordering a test sequence for testing an electronic device, the method is executed by a processor of a test apparatus, the method comprising:
receiving a result of one or more tests performed in a first test sequence, wherein the one or more tests are performed in the first test sequence by a tester, and wherein the tester tests one or more of an operation and a characteristic of the electronic device;

analyzing the result of the one or more tests performed in the first sequence;

determining whether the result of the one or more tests performed indicates a pass or failure associated with each test performed;

determining, based on the analysis, whether to modify the first test sequence;

modifying, in response to determining the result of the one or more tests performed is indicated as a failure, an order of the one or more tests in the first sequence for a modified first test sequence wherein the modified first test sequence orders a test associated with the failure result before other tests associated with passing results in the first test sequence; and forwarding the modified first test sequence to a computing system, comprising a memory and a processor, the processor executing a master test management module, across a communications network;

receiving a plurality of modified first test sequences from a plurality of test apparatuses including the test apparatus;

analyzing each modified first test sequence of the plurality of modified first test sequences received from the plurality of test apparatuses;

determining one of the modified first test sequences to use from the plurality of modified first test sequences as a standard modified first test sequence; and forwarding the standard modified first test sequence to at least one test apparatus of the plurality of test apparatuses.

19. The method of claim 18, wherein analyzing the result of the one or more tests performed in the first test sequence further comprises:

determining a level of functionality associated with the electronic device from the result of the one or more tests; and comparing the level of functionality associated with the electronic device with a stored functionality threshold, wherein the stored functionality threshold includes minimum acceptable functional limits of an electronic device, wherein determining to modify the first test sequence further comprises determining that the level of functionality associated with the electronic device failed to meet the stored functionality threshold.

20. The method of claim 18, wherein the standard modified first test sequence is forwarded to a test management module of the test apparatus across the communications network.

* * * * *